United States Patent
Yasuda

(10) Patent No.: US 8,354,897 B2
(45) Date of Patent: Jan. 15, 2013

(54) ELASTIC WAVE FILTER AND COMMUNICATION DEVICE

(75) Inventor: Junpei Yasuda, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/270,379

(22) Filed: Oct. 11, 2011

(65) Prior Publication Data

US 2012/0262246 A1    Oct. 18, 2012

Related U.S. Application Data

(63) Continuation of application No. PCT/JP2010/054530, filed on Mar. 17, 2010.

(30) Foreign Application Priority Data

Apr. 14, 2009   (JP) ................. 2009-097933

(51) Int. Cl.
    *H03H 9/64*   (2006.01)
(52) U.S. Cl. ............ 333/195; 333/193; 310/313 D
(58) Field of Classification Search ........ 333/133, 333/193–196; 310/313 B, 313 D
    See application file for complete search history.

(56) References Cited

U.S. PATENT DOCUMENTS

| | | |
|---|---|---|
| 2005/0212621 A1 | 9/2005 | Takamine |
| 2006/0208834 A1 * | 9/2006 | Takamine .................. 333/195 |
| 2007/0229194 A1 * | 10/2007 | Takamine .................. 333/195 |
| 2008/0122552 A1 * | 5/2008 | Ouchi .................. 333/5 |
| 2008/0238576 A1 * | 10/2008 | Takahashi et al. ............ 333/195 |
| 2009/0160574 A1 * | 6/2009 | Yamane et al. .................. 333/25 |
| 2010/0259341 A1 | 10/2010 | Nakai |
| 2011/0156841 A1 * | 6/2011 | Takamine .................. 333/195 |

FOREIGN PATENT DOCUMENTS

| | | |
|---|---|---|
| EP | 1 158 672 A2 | 11/2001 |
| EP | 1 289 135 A2 | 3/2003 |
| EP | 1 411 634 A1 | 4/2004 |
| JP | 2000-091881 A | 3/2000 |
| JP | 2002-084163 A | 3/2002 |
| JP | 2003-152502 A | 5/2003 |
| WO | 03/003574 A1 | 1/2003 |
| WO | 2005/031971 A1 | 4/2005 |
| WO | 2009/001651 A1 | 12/2008 |

OTHER PUBLICATIONS

Official Communication issued in International Patent Application No. PCT/JP2010/054530, mailed on Jun. 15, 2010.
English Translation of Official Communication issued in corresponding Japanese Patent Application No. 2010-534301, mailed on Oct. 26, 2010.

* cited by examiner

*Primary Examiner* — Barbara Summons
(74) *Attorney, Agent, or Firm* — Keating & Bennett, LLP

(57) ABSTRACT

An elastic wave filter includes at least a piezoelectric substrate and a longitudinally coupled resonator-type elastic wave filter unit provided on the piezoelectric substrate. The longitudinally coupled resonator-type elastic wave filter unit includes first to fifth IDTs and first and second reflectors arranged on either side of the first to fifth IDTs. The third IDT includes first and second divided comb-shaped electrodes. The second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal. The first and fifth IDTs each have a constant electrode finger pitch, and the electrode finger pitch of the first IDT is less than that of the fifth IDT.

24 Claims, 13 Drawing Sheets

ELASTIC WAVE FILTER AND COMMUNICATION DEVICE

BACKGROUND OF THE INVENTION

1. Field of the Invention

The present invention relates to an elastic wave filter having a balanced-unbalanced conversion function and a communication device including such an elastic wave filter.

2. Description of the Related Art

To reduce the size and/or weight of communication devices, such as cellular phones, the number and size of the components included therein have been reduced in recent years. Moreover, development of components including multiple combined functions has been advanced. With such a situation as a backdrop, surface acoustic wave filters including a balanced-unbalanced conversion function, so-called the balun function, are being used in RF (radio frequency) circuits of communication devices.

However, surface acoustic wave filters including the balanced-unbalanced conversion function have a problem in that signals output from a first balanced signal terminal and those output from a second balanced signal terminal are not well balanced. Balance here refers to amplitude balance and phase balance.

International Publication No. WO2005/031971 discloses a surface acoustic wave filter that includes a balanced-unbalanced conversion function and that improves these types of balance.

FIG. 1 of International Publication No. WO2005/031971 discloses a 3-IDT-type, longitudinally coupled resonator-type surface acoustic wave filter including a balanced-unbalanced conversion function, in which first to third comb-shaped interdigital electrode units (IDTs) are disposed on a piezoelectric substrate in the surface acoustic wave propagation direction. First and second reflectors are disposed on both sides in the surface acoustic wave propagation direction of the area in which the first to third IDTs are disposed. The central second IDT includes first and second divided comb-shaped electrodes. The first and second divided comb-shaped electrodes are formed by dividing one of the comb-shaped electrodes of the second IDT into two portions in the surface acoustic wave propagation direction. The first and second divided comb-shaped electrodes are connected to first and second balanced signal terminals, respectively. The first and third IDTs are mutually connected and then connected to an unbalanced signal terminal. In International Publication No. WO2005/031971, at least one design parameter of the first to third IDTs and the first and second reflectors varies between one side and the other of a virtual central axis A extending in a direction perpendicular to the surface acoustic wave propagation direction. It is stated that this improves balance.

FIG. 13 of International Publication No. WO2005/031971 discloses a 5-IDT-type, longitudinally coupled resonator-type surface acoustic wave filter including a balanced-unbalanced conversion function, in which five IDTs are disposed in the surface acoustic wave propagation direction on a piezoelectric substrate. First and second reflectors are disposed on both sides in the surface acoustic wave propagation directions of the area in which the five IDTs are disposed. International Publication No. WO2005/031971 suggests that such a 5-IDT-type, longitudinally coupled resonator-type surface acoustic wave filter is also preferably configured so that at least one design parameter of the first to fifth IDTs and the first and second reflectors varies between one side and the other of a virtual central axis A extending in a direction perpendicular to the surface acoustic wave propagation direction, similarly to the embodiment of a 3-IDT type, longitudinally coupled resonator-type surface acoustic wave filter.

Unfortunately, International Publication No. WO2005/031971 describes nothing specific with respect to how one side and the other of the virtual central axis are different from each other in the 5-IDT-type, longitudinally coupled resonator-type surface acoustic wave filter having the balanced-unbalanced conversion function.

On the other hand, the 5-IDT-type, longitudinally coupled resonator-type surface acoustic wave filter including the balanced-unbalanced conversion function as described in FIG. 13 of International Publication No. WO2005/031971 has more configurations for making one side and the other of the virtual central axis different from each other than the 3-IDT-type, longitudinally coupled resonator-type surface acoustic wave filter including the balanced-unbalanced conversion function. Accordingly, solely making one side and the other asymmetrical with respect to the virtual central axis does not lead to a sufficient improvement in balance, and instead, balance is deteriorated.

SUMMARY OF THE INVENTION

To overcome the problems described above, preferred embodiments of the present invention provide a longitudinally coupled resonator-type elastic wave filter including a balanced-unbalanced conversion function in which five IDTs are disposed in the elastic wave propagation direction and that more reliably improves the signal balance between first and second balanced signal terminals.

According to a first preferred embodiment of the present invention, an elastic wave filter preferably includes at least a piezoelectric substrate and a longitudinally coupled resonator-type elastic wave filter unit provided on the piezoelectric substrate. The longitudinally coupled resonator-type elastic wave filter unit includes first to fifth IDTs arranged in the surface acoustic wave propagation direction and first and second reflectors arranged in the elastic wave propagation direction so as to be disposed on either side of the area in which the first to fifth IDTs are disposed. Preferably, the third IDT includes first and second divided comb-shaped electrodes disposed in the elastic wave propagation directions, the first divided comb-shaped electrode is disposed adjacent to the second IDT, and the second divided comb-shaped electrode is disposed adjacent to the fourth IDT. The second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal. Each of the first and fifth IDTs has a constant electrode finger pitch, and the electrode finger pitch of the first IDT is preferably less than the electrode finger pitch of the fifth IDT. A signal passing through the first IDT and a signal passing through the second IDT are in phase in the area in which the first and second IDTs are adjacent to each other.

According to a second preferred embodiment of the present invention, an elastic wave filter preferably includes at least a piezoelectric substrate and a longitudinally coupled resonator-type elastic wave filter unit provided on the piezoelectric substrate. The longitudinally coupled resonator-type elastic wave filter unit includes first to fifth IDTs arranged in the elastic wave propagation direction and first and second reflectors arranged in the elastic wave propagation direction so as to be disposed on either side of the area in which the first to fifth IDTs are disposed. Preferably, the third IDT includes first and second divided comb-shaped electrodes disposed in the elastic wave propagation directions, the first divided comb-shaped electrode is disposed adjacent to the second IDT, and the second divided comb-shaped electrode is disposed adjacent to the fourth IDT. The second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal. Each of the first and fifth IDTs has a constant electrode finger pitch, and the electrode finger pitch of the first IDT is preferably less than the electrode finger pitch of the fifth IDT. Adjacent outermost electrode fingers have the same polarity in the area in which the first and second IDTs are adjacent to each other.

According to a third preferred embodiment of the present invention, an elastic wave filter preferably includes at least a piezoelectric substrate and a longitudinally coupled resonator-type elastic wave filter unit provided on the piezoelectric substrate. The longitudinally coupled resonator-type elastic wave filter unit includes first to fifth IDTs arranged in the elastic wave propagation direction and first and second reflectors arranged in the elastic wave propagation direction so as to be disposed on either side of the area in which the first to fifth IDTs are disposed. Preferably, the third IDT includes first and second divided comb-shaped electrodes disposed in the elastic wave propagation directions, the first divided comb-shaped electrode is disposed adjacent to the second IDT, and the second divided comb-shaped electrode is disposed adjacent to the fourth IDT. The second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal. Each of the first and fifth IDTs includes a main-pitch electrode finger section and a narrow-pitch electrode finger section having an electrode finger pitch less than the main-pitch electrode finger section, and the electrode finger pitch of the main-pitch electrode finger section of the first IDT is preferably less than the electrode finger pitch of the main-pitch electrode finger section of the fifth IDT or the electrode finger pitch of the narrow-pitch electrode finger section of the first IDT is preferably less than the electrode finger pitch of the narrow-pitch electrode finger section of the fifth IDT. A signal passing through the first IDT and a signal passing through the second IDT are in phase in the area in which the first and second IDTs are adjacent to each other.

According to a fourth preferred embodiment of the present invention, an elastic wave filter is provided that preferably includes at least a piezoelectric substrate and a longitudinally coupled resonator-type elastic wave filter unit provided on the piezoelectric substrate. The longitudinally coupled resonator-type elastic wave filter unit includes first to fifth IDTs arranged in the elastic wave propagation direction and first and second reflectors arranged in the elastic wave propagation direction so as to be disposed on either side of the area in which the first to fifth IDTs are disposed. Preferably, the third IDT includes first and second divided comb-shaped electrodes disposed in the elastic wave propagation directions, the first divided comb-shaped electrode is disposed adjacent to the second IDT, and the second divided comb-shaped electrode is disposed adjacent to the fourth IDT. The second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal. Each of the first and fifth IDTs includes a main-pitch electrode finger section and a narrow-pitch electrode finger section having an electrode finger pitch less than the main-pitch electrode finger section, and the electrode finger pitch of the main-pitch electrode finger section of the first IDT is preferably less than the electrode finger pitch of the main-pitch electrode finger section of the fifth IDT or the electrode finger pitch of the narrow-pitch electrode finger section of the first IDT is preferably less than the electrode finger pitch of the narrow-pitch electrode finger section of the fifth IDT. Adjacent outermost electrode fingers have the same polarity in the area in which the first and second IDTs are adjacent to each other.

According to a fifth preferred embodiment of the present invention, an elastic wave filter preferably includes at least a piezoelectric substrate and a longitudinally coupled resonator-type elastic wave filter unit provided on the piezoelectric substrate. The longitudinally coupled resonator-type elastic wave filter unit includes first to fifth IDTs arranged in the elastic wave propagation direction and first and second reflectors arranged in the elastic wave propagation direction so as to be disposed on either side of the area in which the first to fifth IDTs are disposed. Preferably, the third IDT includes first and second divided comb-shaped electrodes disposed in the elastic wave propagation directions, the first divided comb-shaped electrode is disposed adjacent to the second IDT, and the second divided comb-shaped electrode is disposed adjacent to the fourth IDT. The second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal. The duty ratio of the first IDT is preferably less than the duty ratio of the fifth IDT. A signal passing through the first IDT and a signal passing through the second IDT are in phase in the area in which the first and second IDTs are adjacent to each other.

According to a sixth preferred embodiment of the present invention, an elastic wave filter preferably includes at least a piezoelectric substrate and a longitudinally coupled resonator-type elastic wave filter unit provided on the piezoelectric substrate. The longitudinally coupled resonator-type elastic wave filter unit includes first to fifth IDTs arranged in the elastic wave propagation direction and first and second reflectors arranged in the elastic wave propagation direction so as to be disposed on either side of the area in which the first to fifth IDTs are disposed. Preferably, the third IDT includes first and second divided comb-shaped electrodes disposed in the elastic wave propagation directions, the first divided comb-shaped electrode is disposed adjacent to the second IDT, and the second divided comb-shaped electrode is disposed adjacent to the fourth IDT. The second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal. The duty ratio of the first IDT is preferably less than the duty ratio of the fifth IDT. Adjacent outermost electrode fingers have the same polarity in the area in which the first and second IDTs are adjacent to each other.

An elastic wave filter according to various preferred embodiments of the present invention may preferably be a surface acoustic wave filter using surface acoustic waves as elastic waves or a boundary acoustic wave filter using boundary acoustic waves as elastic waves.

A communication device according to another preferred embodiment of the present invention includes an elastic wave filter according to a preferred embodiment of the present invention.

According to the first to sixth preferred embodiments of the present invention, in the 5-IDT-type longitudinally coupled resonator-type elastic wave filter including the balanced-unbalanced conversion function in which the first to fifth IDTs are arranged in the elastic wave propagation direction and where the central third IDT includes the first and second divided comb-shaped electrodes, the electrode finger pitches or duty ratios of the first and fifth IDTs, which are located most outwardly, differ from each other. This effectively improves the signal balance between the first and second balanced signal terminals.

In the 3-IDT-type, longitudinally coupled resonator-type surface acoustic wave filter including the balanced-unbalanced conversion function described in International Publication No. WO2005/031971, balance is improved by simply making one side and the other of the virtual central axis different in configuration. The 5-IDT-type, longitudinally coupled resonator-type elastic wave filter including the balanced-unbalanced conversion function has many configurations on one side and the other side of the virtual central axis. Thus, balance cannot necessarily be improved by simply making one side and the other of the virtual central axis different in configuration. In the 5-IDT-type, longitudinally coupled resonator-type elastic wave filter including the balanced-unbalanced conversion function according to various preferred embodiment of the present invention, the electrode finger pitches or duty ratios of the first and fifth IDTs, which are located most outwardly, differ from each other. This effectively improves balance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
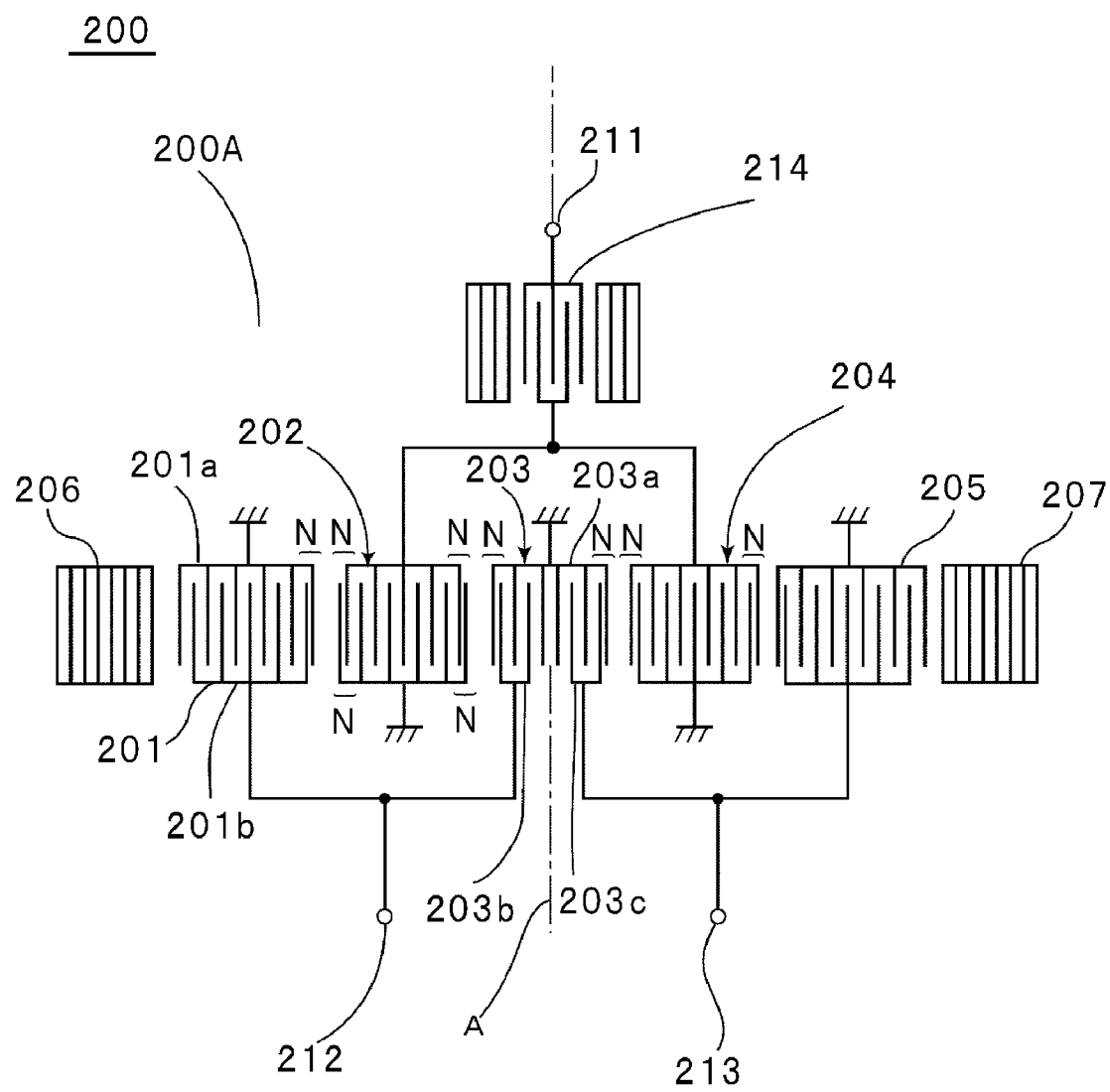
FIG. 1 is a schematic plan view showing the electrode structure of a surface acoustic wave filter according to a first preferred embodiment of the present invention.

Preferred embodiments of the present invention will be clarified with reference to the drawings.
First Preferred Embodiment FIG. 1 is a schematic plan view showing the electrode structure of a surface acoustic wave filter 200 according to a first preferred embodiment of the present invention. The surface acoustic wave filter 200 according to the first preferred embodiment is an elastic wave filter using surface acoustic waves.

In this and later preferred embodiments, elastic wave filters used as filters for receiving PCSs (personal communication services) will be described as non-limiting examples. The pass band of filters for receiving PCSs is about 1930 MHz to about 1990 MHz, for example.

In the surface acoustic wave filter 200 according to this preferred embodiment, an electrode structure as shown in FIG. 1 is preferably provided on a piezoelectric substrate P. A 40°±5° Y-cut, X-propagation LiTaO$_3$ substrate, for example, is preferably used as the piezoelectric substrate P. The electrode structure is not particularly limited. In this preferred embodiment, the electrode structure is preferably made of a metallic material primarily including aluminum, for example.

By providing the above-mentioned electrode structure on the piezoelectric substrate P, a longitudinally coupled resonator-type surface acoustic wave filter unit 200A and a surface acoustic wave resonator 214 connected in series thereto are provided.

The longitudinally coupled resonator-type surface acoustic wave filter unit 200A includes first to fifth IDTs 201 to 205 arranged in the surface acoustic wave propagation direction. First and second reflectors 206 and 207 are disposed on both sides in the surface acoustic wave propagation direction of the area in which the first to fifth IDTs 201 to 205 are disposed. The first and second reflectors 206 and 207 are preferably grating-type reflectors including multiple electrode fingers that are short circuited at both end portions.

The structure of an IDT will be described with reference to the first IDT 201 as an example. The first IDT 201 includes a pair of comb-shaped electrodes 201a and 201b. The comb-shaped electrode 201a includes a busbar and multiple electrode fingers including end portions connected to the busbar. The comb-shaped electrode 201b also includes a busbar and multiple electrode fingers including end portions connected to the busbar. The comb-shaped electrodes 201a and 201b are opposed to each other such that the multiple electrode fingers of the comb-shaped electrode 201a and those of the comb-shaped electrode 201b are alternately arranged. These multiple electrode fingers extend in directions perpendicular to the surface acoustic wave propagation directions.

The second to fifth IDTs 202 to 205 also include multiple comb-shaped electrodes. Note that the central third IDT 203 preferably includes a comb-shaped electrode 203a and first and second divided comb-shaped electrodes 203b and 203c. The first and second divided comb-shaped electrodes 203b and 203c are formed preferably by dividing a comb-shaped electrode on the other side opposed to the comb-shaped electrode 203a into two portions in the surface acoustic wave propagation directions. The first and second divided comb-shaped electrodes 203b and 203c are arranged in the surface acoustic wave propagation directions.

End portions of the second and fourth IDTs 202 and 204 are connected to an unbalanced signal terminal 211 via the surface acoustic wave resonator 214. The other end portions of the second and fourth IDTs 202 and 204 are connected to the ground potential. End portions of the first and fifth IDTs 201 and 205 are connected to the ground potential. The other end portion of the first IDT 201 and the first divided comb-shaped electrode 203b of the third IDT 203 are preferably mutually connected and then connected to a first balanced signal terminal 212. The second divided comb-shaped electrode 203c of the third IDT 203 and the other end portion of the fifth IDT 205 are preferably mutually connected and then connected to a second balanced signal terminal 213.

The comb-shaped electrode 203a of the central third IDT 203 is connected to the ground potential.

The fourth IDT 204 is inverted relative to the second IDT 202 so that, when a signal is input from the unbalanced signal terminal 211, 180°-out-of-phase signals are output from the first and second balanced signal terminals 212 and 213 and so that, when 180°-out-of-phase signals are input from the first and second balanced signal terminals 212 and 213, a signal is output from the unbalanced signal terminal 211. Thus, the surface acoustic wave filter 200 includes a balanced-unbalanced conversion function.

Figure 3:
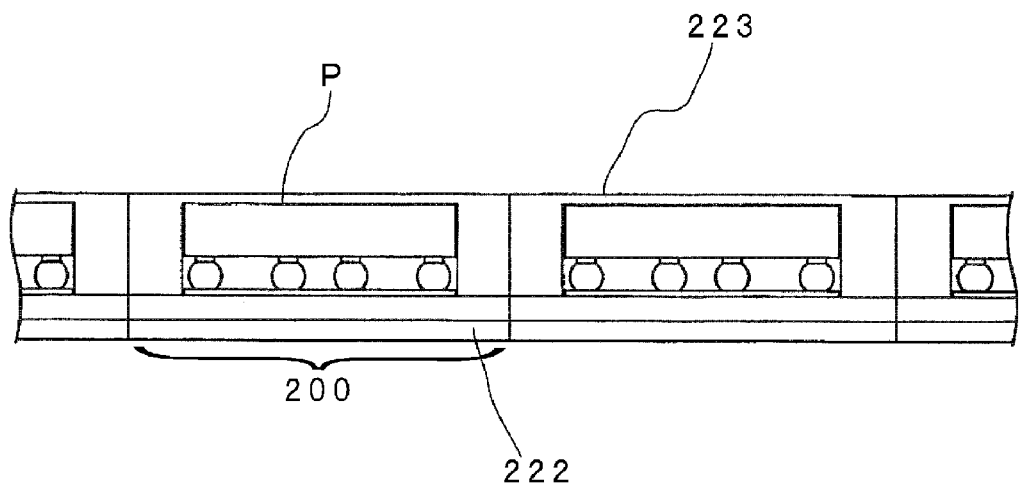
FIG. 3 is a schematic elevational cross-sectional view showing the structure of the surface acoustic wave filter according to the first preferred embodiment of the present invention.

FIG. 3 is schematic elevational cross-sectional view showing the structure of the surface acoustic wave filter 200 according to this preferred embodiment. As shown in FIG. 3, the surface acoustic wave filter 200 preferably includes the piezoelectric substrate P on which the electrode structure shown in FIG. 1 is provided, a base substrate 222 to which the piezoelectric substrate P is flip chip-bonded, and a resin layer 223 arranged to cover the piezoelectric substrate P and the base substrate 222. That is, the surface acoustic wave filter 200 is preferably a CSP (chip size package)-type surface acoustic wave filter. In practice, surface acoustic wave filters 200 are obtained by flip chip-bonding multiple piezoelectric substrates P onto a collective base substrate, then sealing the collective base substrate using a resin, and then cutting it.

Figure 2:
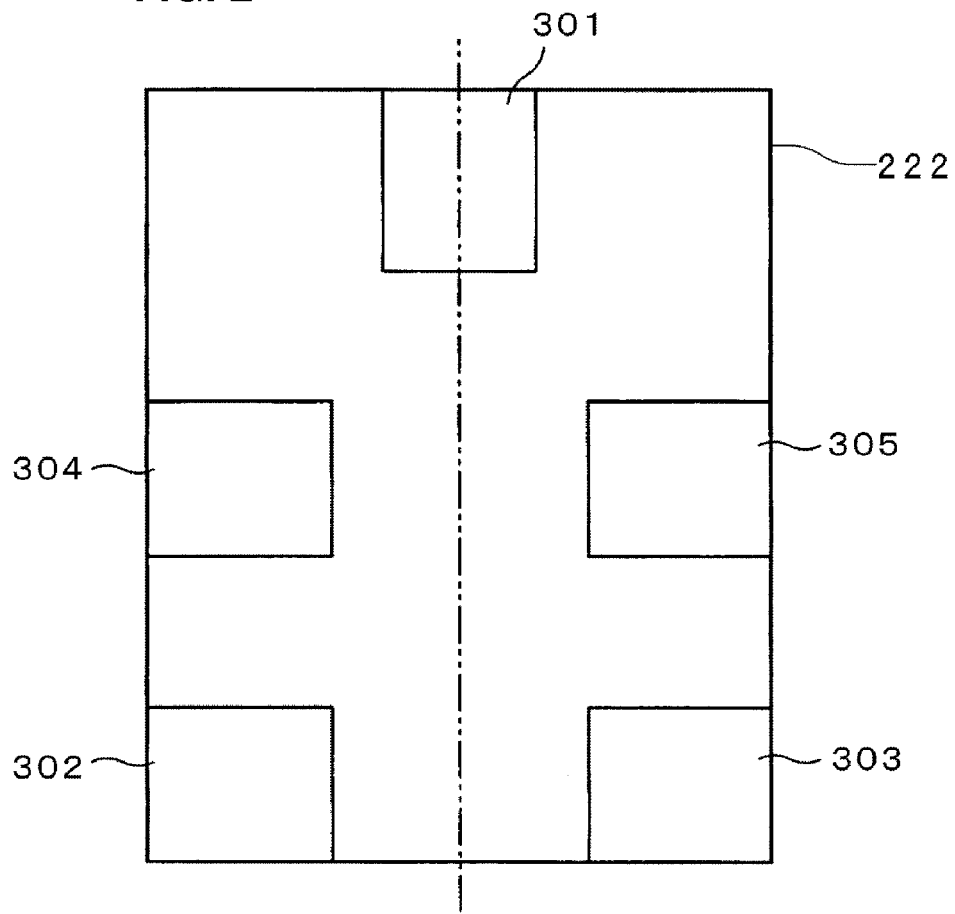
FIG. 2 is a bottom view of the surface acoustic wave filter according to the first preferred embodiment of the present invention.

FIG. 2 is a bottom view of the surface acoustic wave filter 200 according to this preferred embodiment. As shown in FIG. 2, terminal electrodes 301 to 305 for electrically connecting the surface acoustic wave filter 200 to the outside are preferably provided on the bottom of the surface acoustic wave filter 200, that is, on the lower surface of the base substrate 222. The terminal electrodes 301 to 305 are each preferably made of an appropriate electrode material, such as W, for example.

The terminal electrode 301 is electrically connected to the unbalanced signal terminal 211. The terminal electrodes 302 and 303 are electrically connected to the first and second balanced signal terminals 212 and 213, respectively. The terminal electrodes 304 and 305 are terminal electrodes connected to the ground potential.

The lower surface of the base substrate 222 is preferably rectangular or substantially rectangular, and the terminal electrode 301 is preferably disposed along one short side and on a central portion of the short side. The terminal electrodes 302 and 304 and the terminal electrodes 303 and 305 are preferably disposed in a symmetrical manner with respect to the central axis that passes through the short side and is parallel or substantially parallel with long sides. It is preferable that the terminal electrodes 302 and 304 and the terminal electrodes 303 and 305 be disposed in a symmetrical manner with respect to the central axis as described above. This further increases the signal balance between the first and second balanced signal terminals 212 and 213. To further increase the balance, the central axis is preferably located in a position overlapping the virtual central axis A to be described later.

As shown in FIG. 1, in the areas in which two IDTs are adjacent to each other, of the first to fifth IDTs 201 to 205, the electrode finger pitch of the multiple electrode fingers of each IDT, including the outermost electrode finger located at the end portion of the IDT, is preferably less than the electrode finger pitch of the other section of the IDT. This section having the relatively small electrode finger pitch is referred to as a narrow-pitch electrode finger section. In FIG. 1, each narrow-pitch electrode finger section is schematically indicated by N. The section except for the section (narrow-pitch electrode finger section) indicated by N, of an IDT is an electrode finger section having an electrode finger pitch different from that of the narrow-pitch electrode finger section and is referred to as a main-pitch electrode finger section. The electrode finger pitch here refers to the center-to-center distance between adjacent electrode fingers.

As is well known, providing the narrow-pitch electrode finger sections improves continuity of the propagation characteristics of surface acoustic waves in the areas in which the IDTs are adjacent to each other.

The surface acoustic wave filter 200 according to this preferred embodiment is preferably configured as follows. The electrode finger pitches of the main-pitch electrode finger sections of the second and fourth IDTs 202 and 204 are equal or substantially equal to each other. In the third IDT 203, the electrode finger pitches of the main-pitch electrode finger sections of the portion including the comb-shaped electrode 203a and the first divided comb-shaped electrode 203b and the portion including the comb-shaped electrode 203a and the second divided comb-shaped electrode 203c are equal or substantially equal to each other. The electrode finger pitch of the main-pitch electrode finger section of the first IDT 201 is less than that of the main-pitch electrode finger section of the fifth IDT 205.

In the surface acoustic wave filter 200 according to this preferred embodiment, the electrode finger pitch of the main-pitch electrode finger section of the first IDT 201 is preferably less than that of the main-pitch electrode finger section of the fifth IDT 205. More specifically, the electrode finger pitch of the main-pitch electrode finger section of the first IDT 201 is preferably less than that of the main-pitch electrode finger section of the fifth IDT 205 by approximately 0.2%, for example, of the latter electrode finger pitch. This improves balance as described below.

The numbers of electrode fingers of the first to fifth IDTs 201 to 205 are as shown in Table 1 below. The parenthesized numbers represent the numbers of the electrode fingers of the narrow-pitch electrode finger sections. The other numbers represent the numbers of the electrode fingers of the main-pitch electrode finger sections. For the IDT 203, the electrode finger numbers for the portion including the comb-shaped electrode 203a and the first divided comb-shaped electrode 203b and those for the portion including the comb-shaped electrode 203a and the second divided comb-shaped electrode 203c are shown separately.

TABLE 1

| IDT | Electrode finger number |
|---|---|
| 201 | 48 (5) |
| 202 | (3) 67 (5) |
| 203b | (4) 13 |
| 203c | 13 (4) |
| 204 | (5) 67 (3) |
| 205 | (5) 48 |

As shown in FIG. 1, in the area in which the first IDT 201 and the second IDT 202 are adjacent to each other, the outermost electrode fingers of the first IDT 201 and the second IDT 202 are electrode fingers connected to the ground potential. That is, both electrode fingers have the same polarity.

On the other hand, in the area in which the fourth IDT 204 and fifth IDT 205 are adjacent to each other, the outermost electrode finger of the fourth IDT 204 is an electrode finger connected to a signal terminal, and the outermost electrode finger of the fifth IDT 205 is an electrode finger connected to the ground potential. That is, these electrode fingers have different polarities.

In the area in which the second IDT 202 and third IDT 203 are adjacent to each other, the outermost electrode fingers of the fourth IDT 204 and third IDT 203 are electrode fingers connected to the ground potential. That is, both electrode fingers have the same polarity.

On the other hand, in the area in which the third IDT 203 and fourth IDT 204 are adjacent to each other, the outermost electrode finger of the third IDT 203 is an electrode finger connected to the ground potential, and that of the fourth IDT 204 is an electrode finger connected to the signal terminal. That is, these electrode fingers have different polarities.

Thus, in the area in which the first IDT 201 and the second IDT 202 are adjacent to each other, signals passing through the second IDT 202 and those passing through the first IDT 201 are in phase. On the other hand, in the area in which the fourth IDT 204 and fifth IDT 205 are adjacent to each other, signals passing through the fourth IDT 204 and those passing through the fifth IDT 205 are in opposite phase.

That is, this preferred embodiment is preferably configured as follows: in the area in which the first IDT 201 connected to the first balanced signal terminal 212 and located most outwardly and the second IDT 202 connected to the unbalanced signal terminal 211 are adjacent to each other, signals passing through the adjacent IDTs are in phase; in the area in which the fifth IDT 205 connected to the second balanced signal terminal 213 and located most outwardly and the fourth IDT 204 connected to the unbalanced signal terminal 211 are adjacent to each other, signal passing through the adjacent IDTs are in opposite phase; and the electrode finger pitch of the main-pitch electrode finger section of the first IDT 201 is less than that of the main-pitch electrode finger section of the fifth IDT 205.

In this preferred embodiment, the structure provided on the piezoelectric substrate P is symmetrical or substantially symmetrical with respect to the virtual central axis A extending in directions perpendicular to the surface acoustic wave propagation directions except that the electrode finger pitches of the main-pitch electrode finger sections of the first IDT 201 and fifth IDT 205 differ from each other. Thus, balance is improved. This is because only a few unbalanced components occur except that the outermost electrode fingers adjacent to the third IDT 203, of the second IDT 202 and fourth IDT 204 adjacent to the centered third IDT 203 have different polarities.

To compare with the surface acoustic wave filter 200 according to this preferred embodiment, a surface acoustic wave filter according to a first comparative example was prepared. The surface acoustic wave filter according to the first comparative example has substantially the same configuration as that of the surface acoustic wave filter 200 according to this preferred embodiment except that the electrode finger pitches of the main-pitch electrode finger sections of the first IDT 201 and fifth IDT 205 are equal or substantially equal to each other.

Specifically, the first comparative example is configured as follows. The electrode finger pitches of the main-pitch electrode finger sections of the first and fifth IDTs 201 and 205 are equal or substantially equal to each other. The electrode finger pitches of the main-pitch electrode finger sections of the second and fourth IDTs 202 and 204 are equal or substantially equal to each other. In the third IDT 203, the electrode finger pitches of the main-pitch electrode finger sections of the portion including the comb-shaped electrode 203a and the first divided comb-shaped electrode 203b and the portion including the comb-shaped electrode 203a and the second divided comb-shaped electrode 203c are equal or substantially equal to each other.

Figure 4:
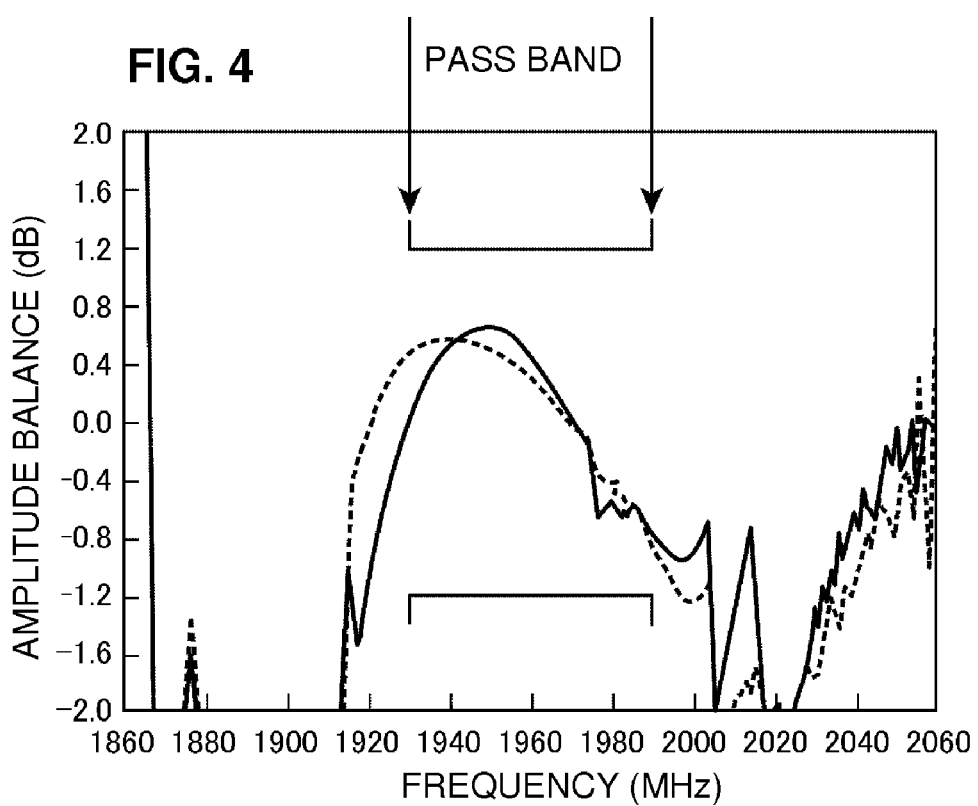
FIG. 4 is a graph showing amplitude balance of each of the surface acoustic wave filter according to the first preferred embodiment of the present invention and a surface acoustic wave filter according to a first comparative example.
Figure 5:
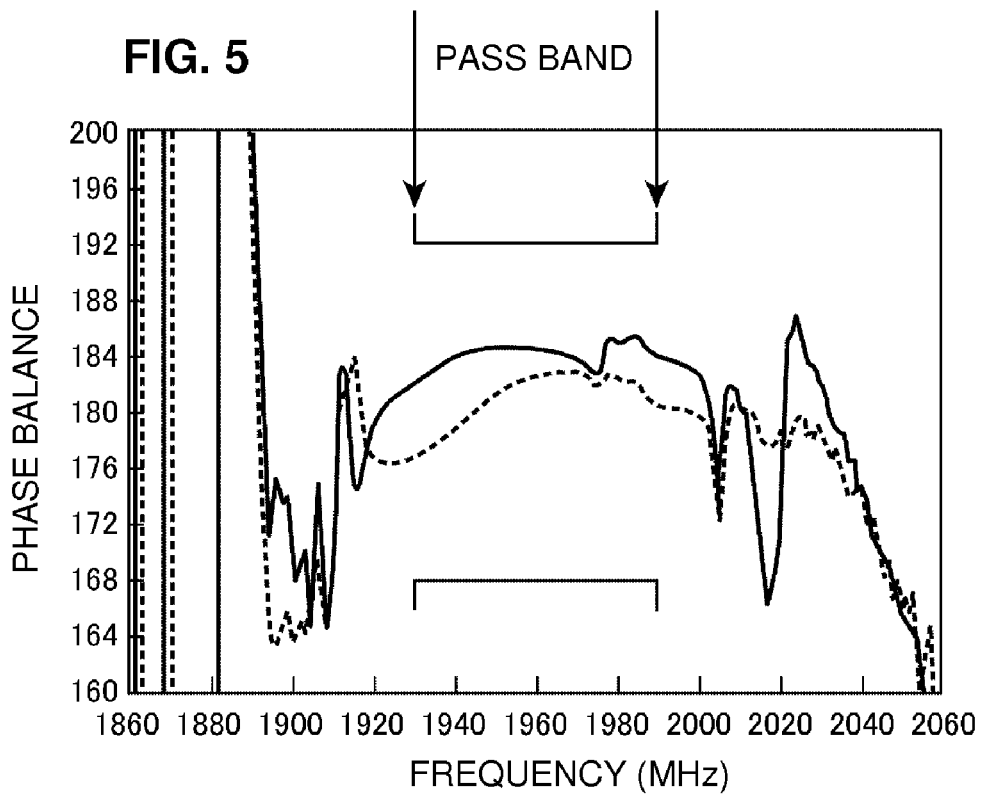
FIG. 5 is a graph showing phase balance of each of the surface acoustic wave filter according to the first preferred embodiment of the present invention and that according to the first comparative example.

FIGS. 4 and 5 are graphs showing the amplitude balance and the phase balance of each of the surface acoustic wave filter 200 according to this preferred embodiment and the surface acoustic wave filter according to the first comparative example. In FIGS. 4 and 5, the solid lines represent the surface acoustic wave filter 200 according to this preferred embodiment, and the broken lines represent the surface acoustic wave filter according to the first comparative example.

Amplitude balance refers to the difference between the amplitude of a signal output from the first balanced signal terminal 212 and that of a signal output from the second balanced signal terminal 213. Phase balance refers to the difference between the phase of a signal output from the first balanced signal terminal 212 and that of a signal output from the second balanced signal terminal 213. Ideally, a surface acoustic wave filter including a balanced-unbalanced conversion function has an amplitude balance of 0 dB and a phase balance of 180° in the pass band. Generally, amplitude balance and phase balance are required to be about −1.2 dB to about +1.2 dB and about 168° to about 192°, respectively, in the pass band.

In estimating the amplitude balance and the phase balance, the sizes of the worst values of the amplitude balance and the phase balance in the pass band are important. That is, the worst values of amplitude balance and phase balance are required to be a relatively small absolute value and a value close to 180°, respectively, in the pass band.

As is apparent from FIG. 4, the value of the amplitude balance is the worst around 1990 MHz, the pass-band upper limit of PCS reception filters, in both this preferred embodiment and the first comparative example. For the first comparative example, amplitude balance at 1990 MHz is approximately −1.0 dB. On the other hand, for this preferred embodiment, amplitude balance at 1990 MHz is −0.8 dB. Thus, according to this preferred embodiment, amplitude balance is improved as compared to the first comparative example by approximately 0.2 dB. This is because the phase difference between a signal output from the first balanced signal terminal 212 and a signal output from the second balanced signal terminal 213 is corrected by making the electrode finger pitches of the main-pitch electrode finger sections of the first IDT 201 and fifth IDT 205 different from one another.

On the other hand, as is apparent from FIG. 5, phase balance according to this preferred embodiment is slightly worse than that according to first comparative example. However, in this preferred embodiment, the worst value of the phase balance falls within the range of about 168° to about 192°. Thus, according to this preferred embodiment, the amplitude balance can be significantly improved without significantly deteriorating the phase balance.

Figure 6:
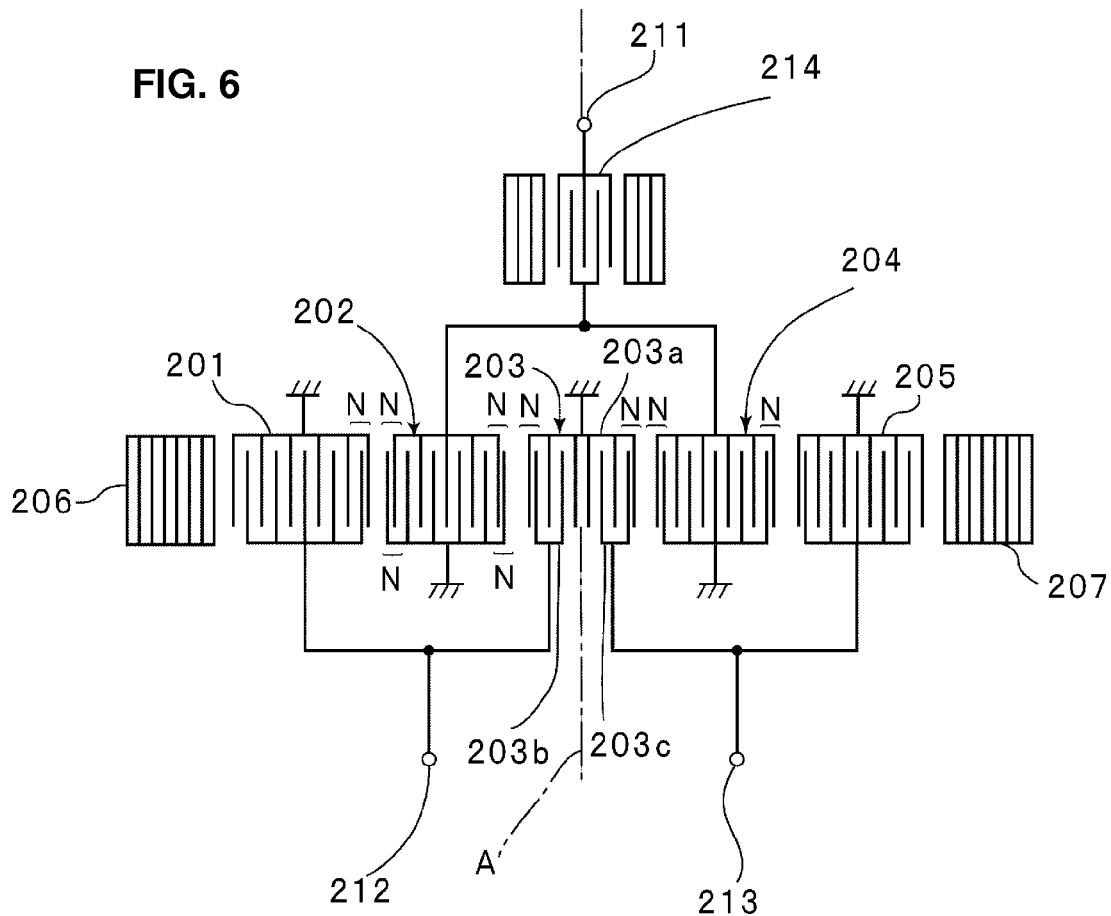
FIG. 6 is a schematic plan view showing the electrode structure of a surface acoustic wave filter according to a second comparative example.

Next, a surface acoustic wave filter according to a second comparative example was prepared. FIG. 6 is a schematic plan view showing the electrode structure of the surface acoustic wave filter according to the second comparative example. In the surface acoustic wave filter according to the second comparative example, the electrode structure as shown in FIG. 6 is provided on the piezoelectric substrate P. In the surface acoustic wave filter according to the second comparative example, in contrast to the surface acoustic wave filter 200 according to this preferred embodiment, the electrode finger pitch of the main-pitch electrode finger section of the fifth IDT 205 is less than that of the main-pitch electrode finger section of the first IDT 201 by approximately, for example, 0.2% of the latter electrode finger pitch. The surface acoustic wave filter according to the second comparative example has substantially the same configuration as that of the surface acoustic wave filter 200 according to this preferred embodiment, except that the electrode finger pitch of the main-pitch electrode finger section of the fifth IDT 205 is less than that of the main-pitch electrode finger section of the first IDT 201.

Specifically, the second comparative example is configured as follows. The electrode finger pitches of the main-pitch electrode finger sections of the second and fourth IDTs 202 and 204 are equal or substantially equal to each other. In the third IDT 203, the electrode finger pitches of the main-pitch electrode finger sections of the portion including the comb-shaped electrode 203a and the first divided comb-shaped electrode 203b and the portion including the comb-shaped electrode 203a and the second divided comb-shaped electrode 203c are equal or substantially to each other. The electrode finger pitch of the main-pitch electrode finger section of the fifth IDT 205 is less than that of the main-pitch electrode finger section of the first IDT 201.

Figure 7:
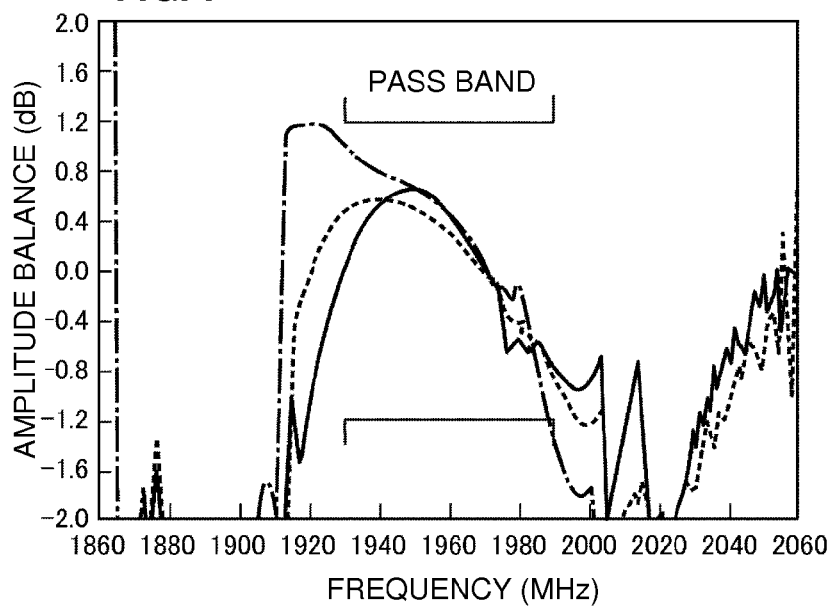
FIG. 7 is a graph showing amplitude balance of each of the surface acoustic wave filter according to the first preferred embodiment of the present invention, that according to the first comparative example, and that according to the second comparative example.
Figure 8:
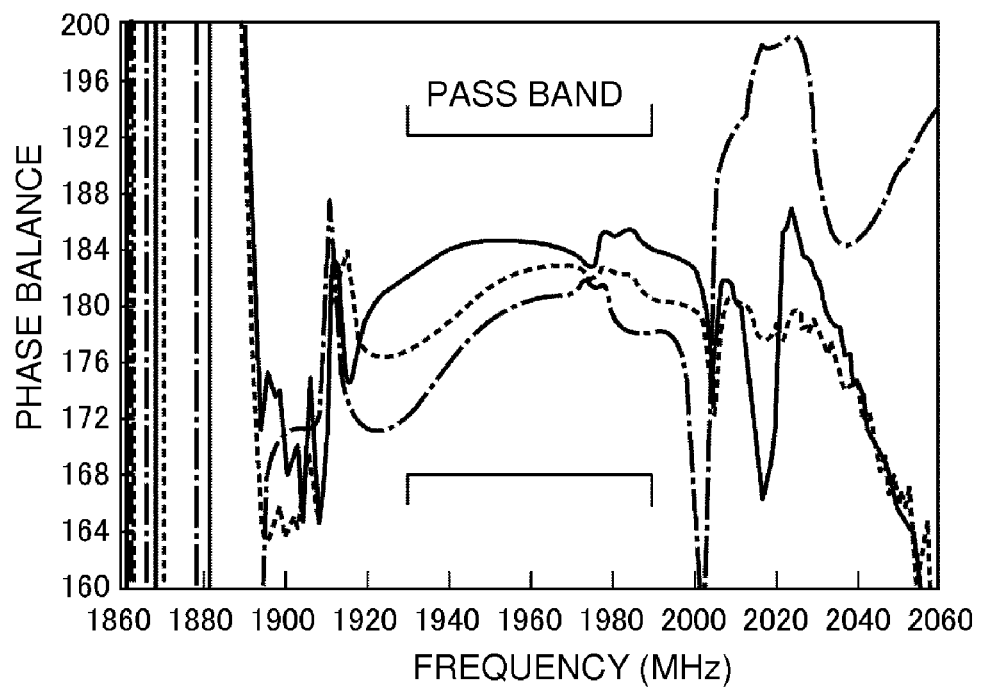
FIG. 8 is a graph showing phase balance of each of the surface acoustic wave filter according to the first preferred embodiment of the present invention, that according to the first comparative example, and that according to the second comparative example.

FIGS. 7 and 8 are graphs showing the amplitude balance and the phase balance of each of the surface acoustic wave filter 200 according to this preferred embodiment, the surface acoustic wave filter according to the first comparative example, and the surface acoustic wave filter according to the second comparative example. In FIGS. 7 and 8, the solid lines represent the surface acoustic wave filter 200 according to this preferred embodiment; the broken lines represent the surface acoustic wave filter according to the first comparative example; and the alternate long and short dashed lines represent the surface acoustic wave filter according to the second comparative example.

As is apparent from FIG. 7, in the second comparative example, the value of the amplitude balance is the worst around 1990 MHz, which is the pass-band upper limit of PCS reception filters. In the second comparative example, the amplitude balance at 1990 MHz is about −1.4 dB and is worse than that of the first comparative example. Moreover, in the second comparative example, amplitude balance does not satisfy the range requirement of about −1.2 dB to about +1.2 dB. Furthermore, as is apparent from FIG. 8, in the second comparative example, the phase balance deteriorates.

Next, a surface acoustic wave filter according to a third comparative example was prepared. Table 2 shows the electrode finger pitches of the main-pitch electrode finger sections of the first to fifth IDTs 201 to 205 of each of the surface acoustic wave filter 200 according to the first preferred embodiment, the surface acoustic wave filter according to the first comparative example and the surface acoustic wave filter according to the third comparative example. For the IDT 203, the electrode finger pitch of the main pitch electrode finger section of the portion including the comb-shaped electrode 203a and the first divided comb-shaped electrode 203b and that of the main pitch electrode finger section of the portion including the comb-shaped electrode 203a and the second divided comb-shaped electrode 203c are shown separately.

This preferred embodiment is configured as follows. The electrode finger pitches of the main-pitch electrode finger sections of the second and fourth IDTs 202 and 204 are equal or substantially equal to λ3, for example. In the third IDT 203, the electrode finger pitches of the main-pitch electrode finger sections of the portion including the comb-shaped electrode 203a and the divided comb-shaped electrode 203b and the portion including the comb-shaped electrode 203a and the second divided comb-shaped electrode 203c are equal or substantially equal to λ4, for example. The electrode finger pitch of the main-pitch electrode finger section of the first IDT 201 is about λ2×0.999, and that of the main-pitch electrode finger section of the fifth IDT 205 is about λ2×1.001, for example. That is, the electrode finger pitch of the main-pitch electrode finger section of the first IDT 201 is less than that of the main-pitch electrode finger section of the fifth IDT 205.

The first comparative example is configured as follows. The electrode finger pitches of the main-pitch electrode finger sections of the first and fifth IDTs 201 and 205 are equal or substantially equal to λ2. The electrode finger pitches of the main-pitch electrode finger sections of the second and fourth IDTs 202 and 204 are equal or substantially equal to λ3. In the third IDT 203, the electrode finger pitches of the main-pitch electrode finger sections of the portion including the comb-shaped electrode 203a and the first divided comb-shaped electrode 203b and the portion including the comb-shaped electrode 203a and the second divided comb-shaped electrode 203c are equal or substantially equal to λ4.

The surface acoustic wave filter according to the third comparative example is configured as follows. The electrode finger pitches of the main-pitch electrode finger sections of the first and fifth IDTs 201 and 205 are equal or substantially equal to λ2. In the third IDT 203, the electrode finger pitches of the main-pitch electrode finger sections of the portion including the comb-shaped electrode 203a and the first divided comb-shaped electrode 203b and the portion including the comb-shaped electrode 203a and the second divided comb-shaped electrode 203c are λ4 and equal or substantially equal to each other. The electrode finger pitch of the main-pitch electrode finger section of the second IDT 202 is about λ3×1.001, and that of the main-pitch electrode finger section of the fourth IDT 204 is about λ3×0.999. That is, the electrode finger pitches of the main-pitch electrode finger sections of the second IDT 202 and fourth IDT 204 differ from each other. The third comparative example has substantially the same configuration as that of the surface acoustic wave filter 200 according to this preferred embodiment except for the electrode finger pitches of the main-pitch electrode finger sections of the first to fifth IDTs 201 to 205.

TABLE 2

| | Electrode finger pitch of main-pitch electrode finger section | | |
|---|---|---|---|
| IDT | First comparative example | First preferred embodiment | Third comparative example |
| 201 | λ2 | λ2 × 0.999 | λ2 |
| 202 | λ3 | λ3 | λ3 × 1.001 |
| 203b | λ4 | λ4 | λ4 |
| 203c | λ4 | λ4 | λ4 |
| 204 | λ3 | λ3 | λ3 × 0.999 |
| 205 | λ2 | λ2 × 1.001 | λ2 |

Figure 9:
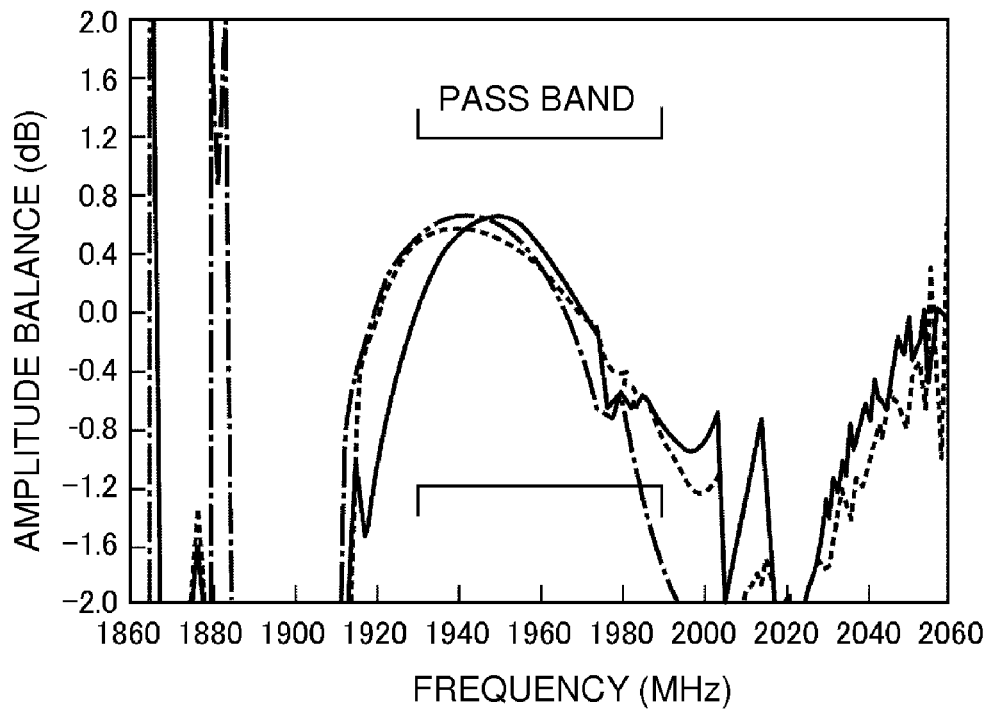
FIG. 9 is a graph showing amplitude balance of each of the surface acoustic wave filter according to the first preferred embodiment of the present invention, that according to the first comparative example, and that according to a third comparative example.
Figure 10:
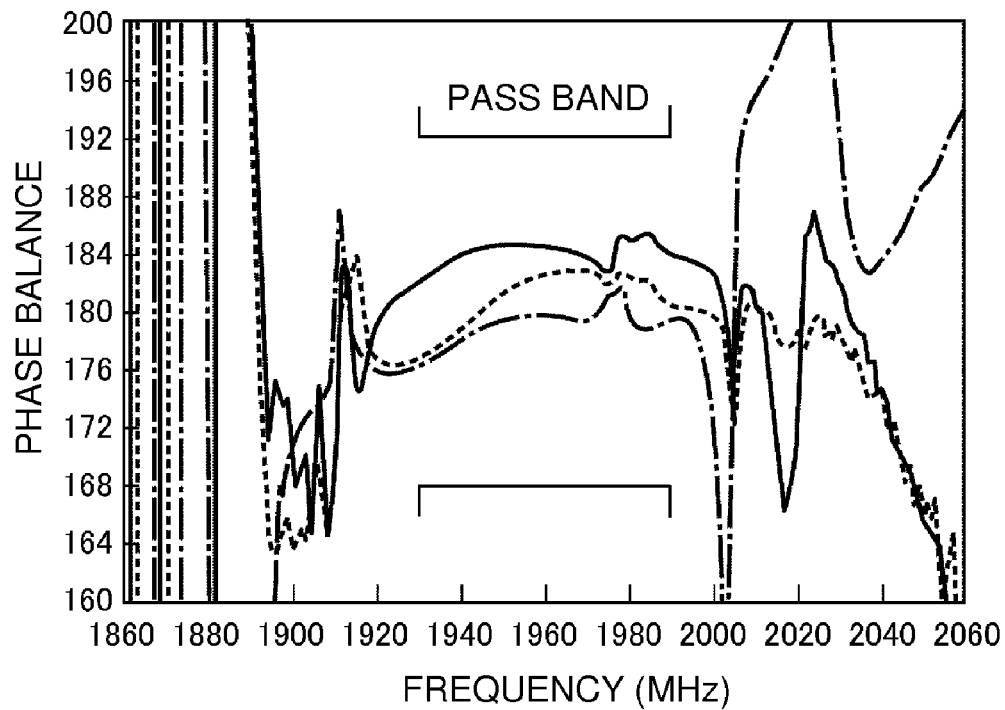
FIG. 10 is a graph showing phase balance of each of the surface acoustic wave filter according to the first preferred embodiment of the present invention, that according to the first comparative example, and that according to the third comparative example.

FIGS. 9 and 10 are graphs showing amplitude balance and phase balance of each of the surface acoustic wave filter 200 according to this preferred embodiment, the surface acoustic wave filter according to the first comparative example, and the surface acoustic wave filter according to the third comparative example. In FIGS. 9 and 10, the solid lines represent the surface acoustic wave filter 200 according to this preferred embodiment; the broken lines represent the surface acoustic wave filter according to the first comparative example; and the alternate long and short dashed lines represent the surface acoustic wave filter according to the third comparative example.

In the third comparative example, the outermost electrode fingers of the third IDT 203 are electrode fingers connected to the neutral point potential, that is, the ground potential, the outermost electrode finger adjacent to the third IDT 203, of the second IDT 202 is an electrode finger connected to the ground potential, and the outermost electrode finger adjacent to the third IDT 203, of the fourth IDT 204 is an electrode finger connected to a signal terminal. Accordingly, as described above, the electrode finger pitch of the main-pitch electrode finger section of the second IDT 202 is greater than that of the main-pitch electrode finger section of the fourth IDT 204.

As is apparent from FIG. 9, in the third comparative example, the value of the amplitude balance is the worst around 1990 MHz, which is the pass-band upper limit of PCS reception filters. In the third comparison example, the amplitude balance at 1990 MHz is about −1.7 dB and is worse than in the first comparison example. Moreover, in the third comparative example, the amplitude balance does not satisfy the range requirement of about −1.2 dB to about +1.2 dB. Conceivably, this is because the electrical connection between the second IDT 202 and the fourth IDT 204 causes a change in a parameter of one of these IDTs so as to adversely affect the other IDT.

Next, a surface acoustic wave filter according to a fourth comparative example was prepared. Table 3 shows the electrode finger pitches of the main-pitch electrode finger sections of the first to fifth IDTs 201 to 205 of each of the surface acoustic wave filter 200 according to the first preferred embodiment, the surface acoustic wave filter according to the first comparative example, and the surface acoustic wave filter according to the fourth comparative example. For the IDT 203, the electrode finger pitch of the main pitch electrode finger section of the portion including the comb-shaped electrode 203a and the first divided comb-shaped electrode 203b and that of the main pitch electrode finger section of the portion including the comb-shaped electrode 203a and the second divided comb-shaped electrode 203c are shown separately. λ2 to λ4 in Table 3 are the same values as λ2 to λ4 in Table 2.

TABLE 3

| | Electrode finger pitch of main-pitch electrode finger section | | |
|---|---|---|---|
| IDT | First comparative example | First preferred embodiment | Fourth comparative example |
| 201 | λ2 | λ2 × 0.999 | λ2 |
| 202 | λ3 | λ3 | λ3 |
| 203b | λ4 | λ4 | λ4 × 1.001 |
| 203c | λ4 | λ4 | λ4 × 0.999 |
| 204 | λ3 | λ3 | λ3 |
| 205 | λ2 | λ2 × 1.001 | λ2 |

As is apparent from Table 3, the surface acoustic wave filter according to the fourth comparative example is configured as follows. The electrode finger pitches of the main-pitch electrode finger sections of the first and fifth IDTs 201 and 205 are equal or substantially equal to λ2. The electrode finger pitches of the main-pitch electrode finger sections of the second and fourth IDTs 202 and 204 are equal or substantially equal to λ3. In the third IDT 203, the electrode finger pitch of the main-pitch electrode finger section of the portion including the comb-shaped electrode 203a and the first divided comb-shaped electrode 203b is about λ4×1.001, and that of the main-pitch electrode finger section of the portion including the comb-shaped electrode 203a and the second divided comb-shaped electrode 203c is about λ4×0.999. That is, in the third IDT 203, the electrode finger pitches of the main-pitch electrode finger sections of the portion including the comb-shaped electrode 203a and the first divided comb-shaped electrode 203b and the portion including the comb-shaped electrode 203a and the second divided comb-shaped electrode 203c differ from each other. The fourth comparative example has substantially the same configuration as that of the surface acoustic wave filter 200 according to this preferred embodiment except for the electrode finger pitches of the main-pitch electrode finger sections of the first to fifth IDTs 201 to 205.

Figure 11:
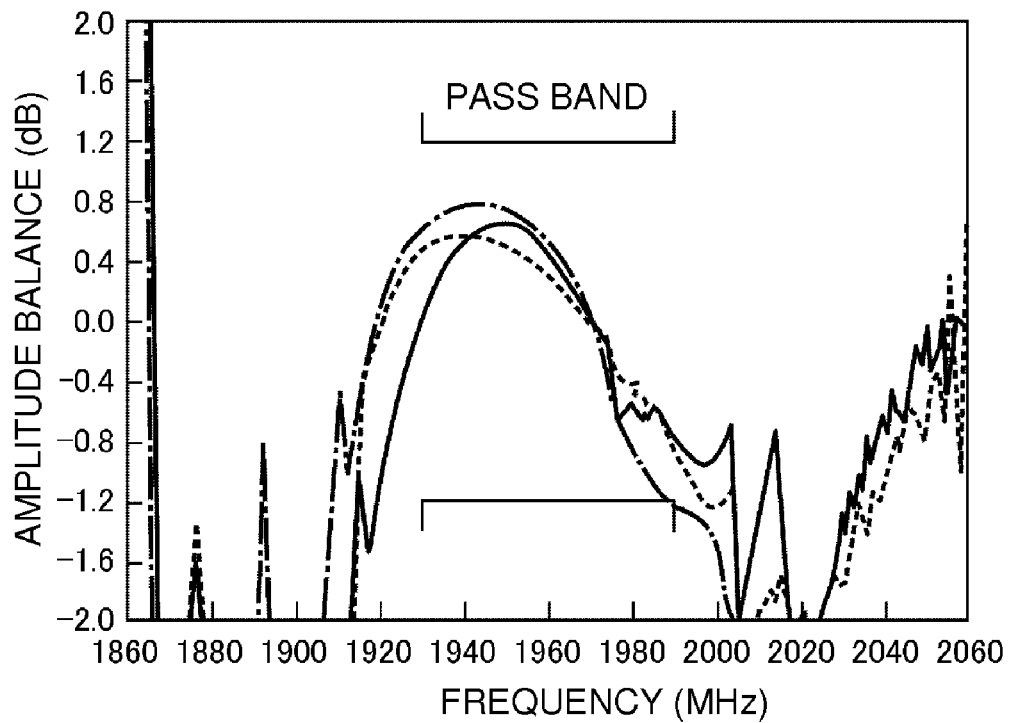
FIG. 11 is a graph showing amplitude balance of each of the surface acoustic wave filter according to the first preferred embodiment of the present invention, that according to the first comparative example, and that according to a fourth comparative example.
Figure 12:
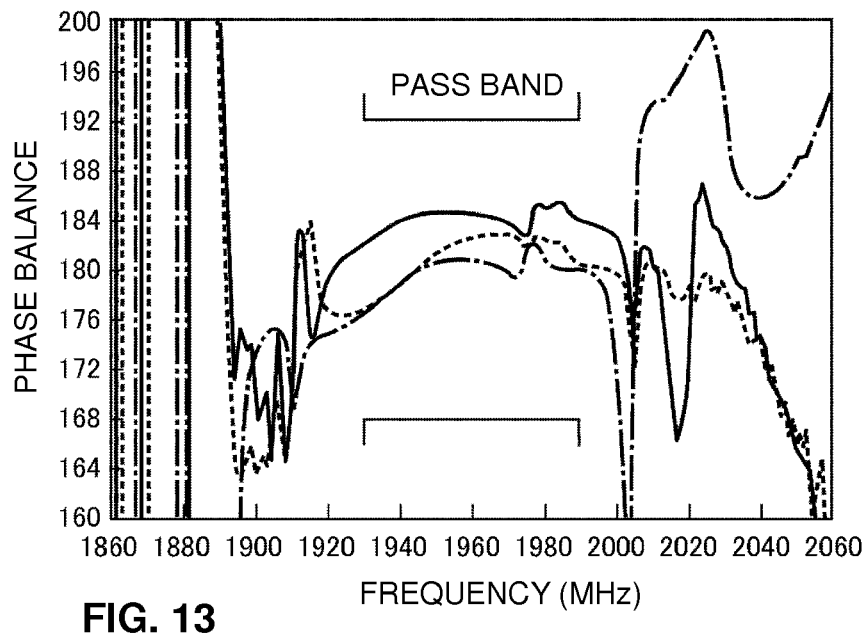
FIG. 12 is a graph showing phase balance of each of the surface acoustic wave filter according to the first preferred embodiment of the present invention, that according to the first comparative example, and that according to the fourth comparative example.

FIGS. 11 and 12 are graphs showing the amplitude balance and the phase balance of each of the surface acoustic wave filter 200 according to this preferred embodiment, the surface acoustic wave filter according to the first comparative example, and the surface acoustic wave filter according to the fourth comparative example. In FIGS. 11 and 12, the solid lines represent the surface acoustic wave filter 200 according to this preferred embodiment; the broken lines represent the surface acoustic wave filter according to the first comparative example; and the alternate long and short dashed lines represent the surface acoustic wave filter according to the fourth comparative example.

As is apparent from FIG. 11, in the fourth comparative example, the value of amplitude balance is the worst around 1990 MHz, which is the pass-band upper limit of PCS reception filters. In the fourth comparative example, the amplitude balance at 1990 MHz is about −1.4 dB and is worse than in the first comparative example. Moreover, in the fourth comparative example, the amplitude balance does not satisfy the range requirement of about −1.2 dB to about +1.2 dB. Conceivably, this is because the adjacency between the electrode fingers of the first divided comb-shaped electrode 203b and the second divided comb-shaped electrode 203c of the third IDT 203 strengthens acoustic coupling so that a change in a parameter of one of these divided comb-shaped electrodes adversely affects the other divided comb-shaped electrode.

As is shown from the above-mentioned results of the first preferred embodiment and the first to fourth comparative examples, in the area in which the first IDT 201 connected to the first balanced signal terminal 212 and located most outwardly and the second IDT 202 connected to the unbalanced signal terminal 211 are adjacent to each other, signals passing through the adjacent IDTs are in phase and in the area in which the fifth IDT 205 connected to the second balanced signal terminal 213 and located most outwardly and the fourth IDT 204 connected to the unbalanced signal terminal 211 are adjacent to each other, signals passing through the adjacent IDTs are in opposite phase, a setting needs to be made so that the electrode finger pitch of the main-pitch electrode finger section of the first IDT 201 is less than that of the main-pitch electrode finger section of the fifth IDT 205; and such a setting significantly improves balance.

While, in the first preferred embodiment, the electrode finger pitches of the entire main-pitch electrode finger sections of the first and fifth IDTs 201 and 205 preferably differ from each other, only a portion of the electrode finger pitches of the main-pitch electrode finger sections of these IDTs may differ from each other. Alternatively, the electrode finger pitches of the narrow-pitch electrode finger sections of the first IDT 201 and fifth IDT 205 may also differ from each other. In this case also, as in the first preferred embodiment, balance is improved.

While, in the first preferred embodiment, the narrow-pitch electrode finger sections are preferably provided in the first to fifth IDTs 201 to 205, the electrode finger pitch may be constant without providing any narrow-pitch electrode finger sections. Even in this case, balance can be improved by making the electrode finger pitches of the first and fifth IDTs 201 and 205 partially or entirely different from each other, which have a constant electrode finger pitch respectively.

In the first preferred embodiment, preferably a 40°±5° Y-cut, X-propagation LiTaO$_3$ substrate, for example, is used as the piezoelectric substrate P. However, the present invention is not limited thereto. As is apparent from the principle by which the advantages of preferred embodiments of the present invention are obtained, other piezoelectric monocrystal substrates may also be used. For example, use of a 64°-to-72° Y-cut, X-propagation LiNbO$_3$ substrate, 41° Y-cut, X-propagation LiNbO$_3$ substrate, or other suitable piezoelectric substrate also enables similar advantages to be obtained.

In the first preferred embodiment, the electrode fingers of the comb-shaped electrode 203a opposed to the first and second divided comb-shaped electrodes 203b and 203c of the third IDT 203 may preferably be floating electrode fingers. Even in this case, advantages similar to those of the above-mentioned preferred embodiment are obtained.

Second Preferred Embodiment

Figure 13:
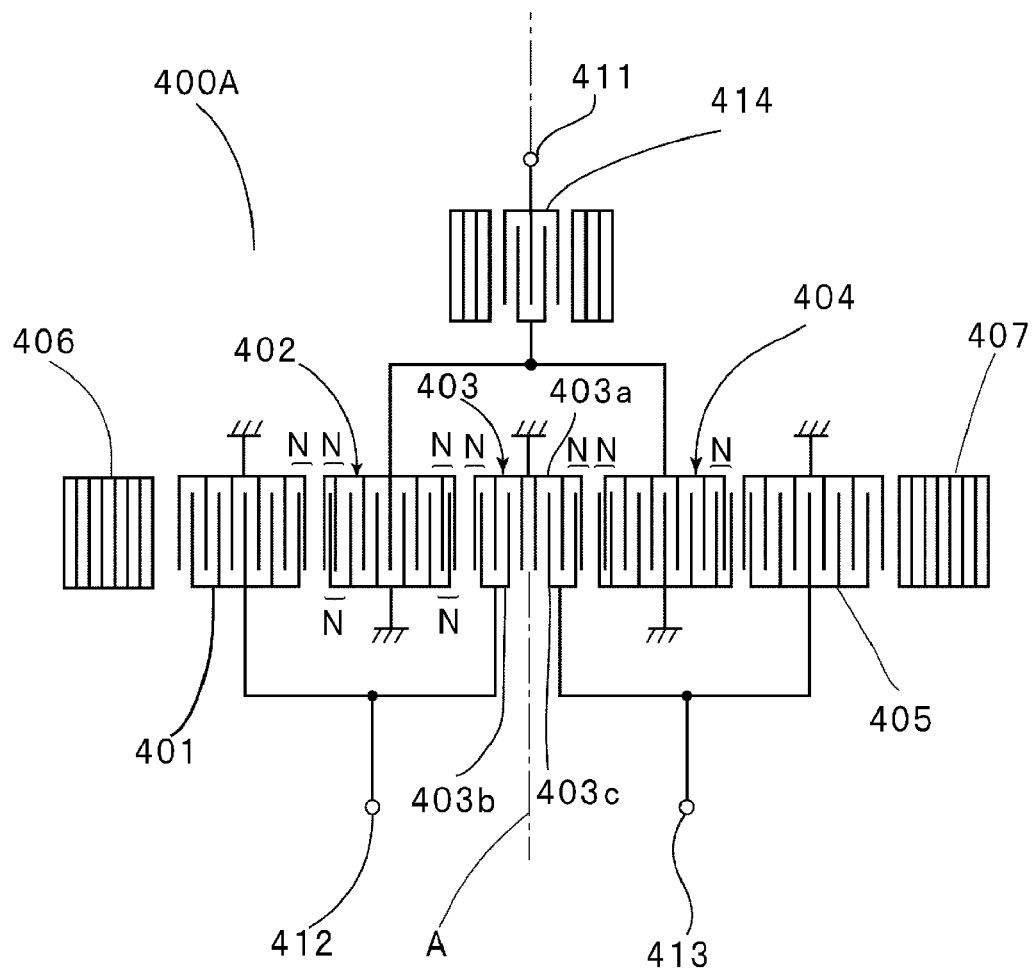
FIG. 13 is a schematic plan view showing the electrode structure of a surface acoustic wave filter according to a second preferred embodiment of the present invention.

FIG. 13 is a schematic plan view showing the electrode structure of a surface acoustic wave filter 400 according to a second preferred embodiment of the present invention.

In the surface acoustic wave filter 400 according to the second preferred embodiment, the electrode structure as shown in FIG. 13 is provided on the piezoelectric substrate P. As in the surface acoustic wave filter 200 according to the first preferred embodiment, the surface acoustic wave filter 400 according to the second preferred embodiment preferably includes a longitudinally coupled resonator-type surface acoustic wave filter unit 400A and a surface acoustic wave resonator 414 coupled in series thereto. The surface acoustic wave filter 400 according to the second preferred embodiment has a basic structure similar to that of the surface acoustic wave filter 200 according to the first preferred embodiment. For this reason, the same components are assigned 400-range reference numerals rather than 200-range ones and will not be described in detail.

In the second preferred embodiment, the longitudinally coupled resonator-type surface acoustic wave filter unit 400A preferably includes first to fifth IDTs 401 to 405 disposed in the surface acoustic wave propagation direction. The central third IDT 403 preferably includes a comb-shaped electrode 403a and first and second divided comb-shaped electrodes 403b and 403c. The first and second divided comb-shaped electrodes 403b and 403c are preferably formed by dividing a comb-shaped electrode on the other side opposed to the comb-shaped electrode 403a into two portions in the surface acoustic wave propagation directions. The first and second divided comb-shaped electrodes 403b and 403c are arranged in the surface acoustic wave propagation direction. First and second reflectors 406 and 407 are disposed on both sides in the surface acoustic wave propagation directions of the area in which the first to fifth IDTs 401 to 405 are disposed. Note that, in the surface acoustic wave filter 400 according to the second preferred embodiment, the second and fourth IDTs 402 and 404 are inverted relative to the second and fourth IDTs 202 and 204, respectively, of the surface acoustic wave filter 200 according to the first preferred embodiment.

End portions of the second and fourth IDTs 402 and 404 are connected to an unbalanced signal terminal 411 via a surface acoustic wave resonator 414. The other end portions of the second and fourth IDTs 402 and 404 are connected to the ground potential. End portions of the first and fifth IDTs 401 and 405 are connected to the ground potential. The other end portion of the first IDT 401 and the first divided comb-shaped electrode 403b of the third IDT 403 are mutually connected and then connected to a first balanced signal terminal 412. The second divided comb-shaped electrode 403c of the third IDT 403 and the other end portion of the fifth IDT 405 are mutually connected and then connected to a second balanced signal terminal 413. The comb-shaped electrode 403a of the central third IDT 403 is connected to the ground potential.

In the second preferred embodiment, as in the first preferred embodiment, the fourth IDT 404 is inverted relative to the second IDT 402 so as to provide a balanced-unbalanced conversion function.

As shown in FIG. 13, narrow-pitch electrode finger sections are preferably provided in the areas in which two IDTs are adjacent to each other, of the first to fifth IDTs 401 to 405. The electrode finger pitch of the multiple electrode fingers of a narrow-pitch electrode finger section of an IDT, including the outermost electrode finger located at the end portion of the IDT, is preferably less than the electrode finger pitch of the other section of the IDT. In FIG. 13, each narrow-pitch electrode finger section is schematically indicated by N. The section except the section (narrow-pitch electrode finger section) indicated by N, of an IDT is an electrode finger section having an electrode finger pitch different from that of the narrow-pitch electrode finger section, that is, a main-pitch electrode finger section.

As shown in FIG. 13, in the area in which the first IDT 401 and the second IDT 402 are adjacent to each other, the outermost electrode finger of the first IDT 401 is an electrode finger connected to the ground potential, and the outermost electrode finger of the second IDT 402 is an electrode finger connected to a signal terminal. That is, both electrode fingers have different polarities.

On the other hand, in the area in which the fourth IDT 404 and the fifth IDT 405 are adjacent to each other, the outermost electrode fingers of the fourth IDT 404 and the fifth IDT 405 are electrode fingers connected to the ground potential. That is, both electrode fingers have the same polarity.

In the area in which the second IDT 402 and the third IDT 403 are adjacent to each other, the outermost electrode finger of the second IDT 402 is an electrode finger connected to the signal terminal, and that of the third IDT 403 is an electrode finger connected to the ground potential. That is, both electrode fingers have different polarities.

On the other hand, in the area in which the third IDT 403 and the fourth IDT 404 are adjacent to each other, the outermost electrode fingers of the third IDT 403 and the fourth IDT 404 are electrode fingers connected to the ground potential. That is, both electrode fingers have the same polarity.

Thus, in the area in which the first IDT 401 and the second IDT 402 are adjacent to each other, signals passing through the second IDT 402 and those passing through the first IDT 401 are in opposite phase. On the other hand, in the area in which the fourth IDT 404 and the fifth IDT 405 are adjacent to each other, signals passing through the fourth IDT 404 and those passing through the fifth IDT 405 are in phase.

The surface acoustic wave filter 400 according to this preferred embodiment is preferably configured as follows. The electrode finger pitches of the main-pitch electrode finger sections of the second and fourth IDTs 402 and 404 are equal or substantially equal to each other. In the third IDT 403, the electrode finger pitches of the main-pitch electrode finger sections of the portion including the comb-shaped electrode 403a and the first divided comb-shaped electrode 403b and the portion including the comb-shaped electrode 403a and the second divided electrode 403c are equal or substantially equal to each other. The electrode finger pitch of the main-pitch electrode finger section of the fifth IDT 405 is less than that of the main-pitch electrode finger section of the first IDT 401.

In the surface acoustic wave filter 400 according to this preferred embodiment, the electrode finger pitch of the main-pitch electrode finger section of the fifth IDT 405 is less than that of the main-pitch electrode finger section of the first IDT 401. More specifically, the electrode finger pitch of the main-pitch electrode finger section of the fifth IDT 405 is less than that of the main-pitch electrode finger section of the first IDT 401 by, for example, approximately 0.2% of the latter electrode finger pitch.

That is, this preferred embodiment is preferably configured such that in the area in which the first IDT 401 connected to the first balanced signal terminal 412 and located most outwardly and the second IDT 402 connected to the unbalanced signal terminal 411 are adjacent to each other, signals passing through the adjacent two IDTs are in phase; in the area in which the fifth IDT 405 connected to the second balanced signal terminal 413 and located most outwardly and the fourth IDT 404 connected to the unbalanced signal terminal 411 are adjacent to each other, signals passing through the adjacent two IDTs are in opposite phase; and the electrode finger pitch of the main-pitch electrode finger section of the fifth IDT 405 is less than that of the main-pitch electrode finger section of the first IDT 401.

In this preferred embodiment, the structure provided on the piezoelectric substrate P is symmetrical or substantially symmetrical with respect to the virtual central axis A extending in directions perpendicular to the surface acoustic wave propagation directions except that the electrode finger pitches of the main-pitch electrode finger sections of the first IDT 401 and fifth IDT 405 differ from each other. Thus, balance is improved. This is because few unbalanced components occur except that the outermost electrode fingers adjacent to the third IDT 403, of the second IDT 402 and fourth IDT 404 adjacent to the central third IDT 403 have different polarities between the second IDT 402 and fourth IDT 404.

To compare with the surface acoustic wave filter 400 according to this preferred embodiment, a surface acoustic wave filter according to a fifth comparative example and one according to a sixth comparative example were prepared. The surface acoustic wave filter according to the fifth comparative example has substantially the same configuration as that of the surface acoustic wave filter 400 according to this preferred embodiment, except that the electrode finger pitches of the main-pitch electrode finger sections of the first IDT 401 and the fifth IDT 405 are equal or substantially equal to each other. In the surface acoustic wave filter according to the sixth comparative example, in contrast to the surface acoustic wave filter 400 according to this preferred embodiment, the electrode finger pitch of the main-pitch electrode finger section of the first IDT 401 is less than that of the main-pitch electrode finger section of the fifth IDT 405 by, for example, approximately 0.2% of the latter electrode finger pitch. The surface acoustic wave filter according to the sixth comparative example has substantially the same configuration as that of the surface acoustic wave filter 400 according to this preferred embodiment, except that the electrode finger pitch of the main-pitch electrode finger section of the first IDT 401 is less than that of the main-pitch electrode finger section of the fifth IDT 405.

Figure 14:
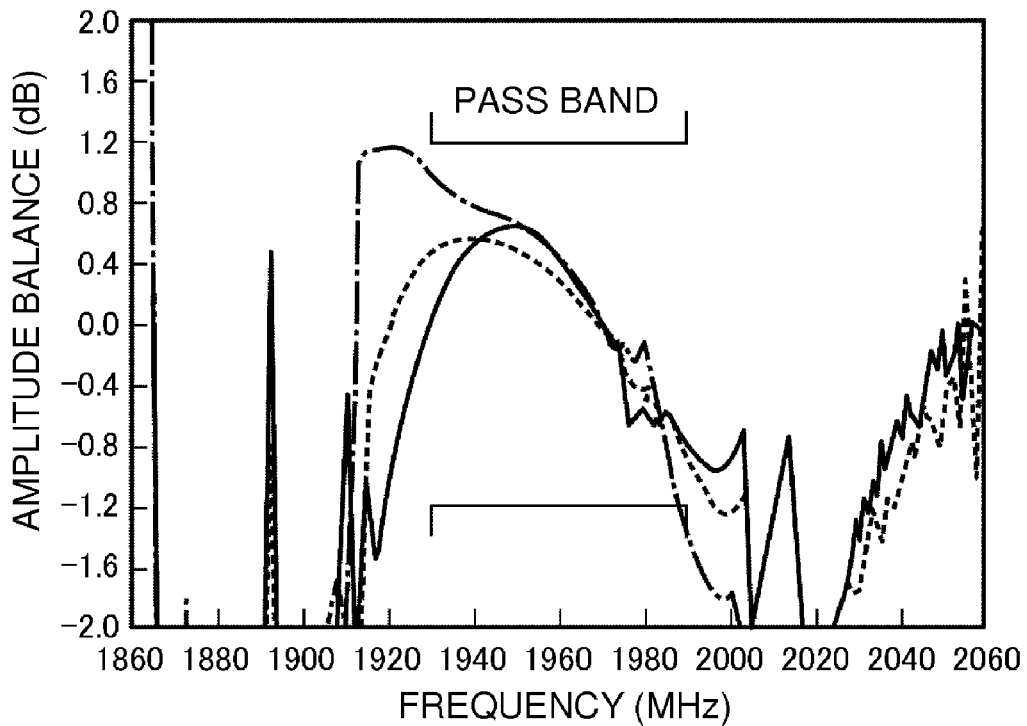
FIG. 14 is a graph showing amplitude balance of each of the surface acoustic wave filter according to the second preferred embodiment of the present invention, that according to a fifth comparative example, and that according to a sixth comparative example.
Figure 15:
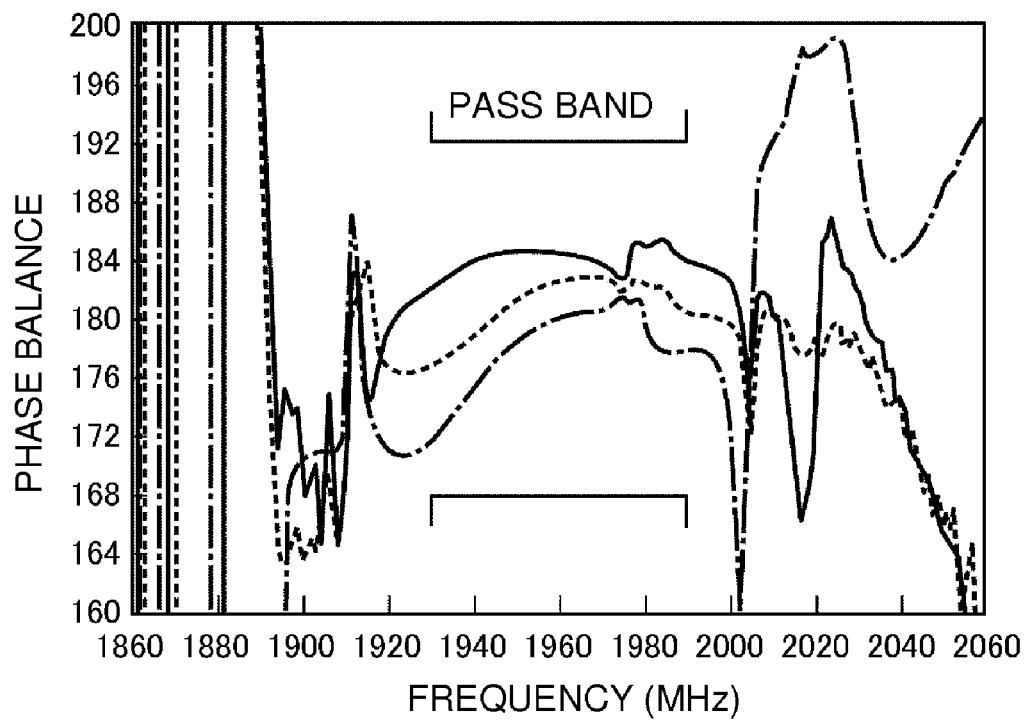
FIG. 15 is a graph showing phase balance of each of the surface acoustic wave filter according to the second preferred embodiment of the present invention, that according to the fifth comparative example, and that according to the sixth comparative example.

FIGS. 14 and 15 are graphs showing the amplitude balance and the phase balance of each of the surface acoustic wave filter 400 according to this preferred embodiment, the surface acoustic wave filter according to the fifth comparative example, and the surface acoustic wave filter according to the sixth comparative example. In FIGS. 14 and 15, the solid lines represent the surface acoustic wave filter 400 according to this preferred embodiment; the broken lines represent the surface acoustic wave filter according to the fifth comparative example; and the alternate long and short dashed lines represent the surface acoustic wave filter according to the sixth comparative example.

As is apparent from FIG. 14, the value of the amplitude balance is the worst around 1990 MHz, which is the pass-band upper limit of PCS reception filters, in both this preferred embodiment and the fifth comparative example. In the fifth comparative example, amplitude balance at 1990 MHz is about −1.1 dB. On the other hand, in this preferred embodiment, amplitude balance at 1990 MHz is about −0.8 dB. Thus, the amplitude balance according to this preferred embodiment is improved compared with that according to the fifth comparative example by approximately 0.3 dB. This is because the phase difference between a signal output from the first balanced signal terminal 412 and a signal output from the second balanced signal terminal 413 is corrected by the electrode finger pitches of the main-pitch electrode finger sections of the first IDT 401 and the fifth IDT 405 being different from one another.

On the other hand, as is apparent from FIG. 15, the phase balance according to this preferred embodiment is slightly worse than that according to the fifth comparative example. However, in this preferred embodiment, the worst value of phase balance falls within the range of about 168° to about 192°.

As is apparent from FIG. 14, in the sixth comparative example, the value of amplitude balance is the worst around 1990 MHz, which is the pass-band upper limit of PCS reception filters. In the sixth comparative example, amplitude balance at 1990 MHz is approximately −1.4 dB and is worse than in the fifth comparative example. Moreover, in the sixth comparative example, the amplitude balance does not satisfy the range requirement of about −1.2 dB to about +1.2 dB. Furthermore, as is apparent from FIG. 15, the phase balance is deteriorated according to the sixth comparative example. Thus, as is shown from FIGS. 14 and 15, in the second preferred embodiment, the amplitude balance can be improved without significantly deteriorating the phase balance.

Third Preferred Embodiment

Figure 16:
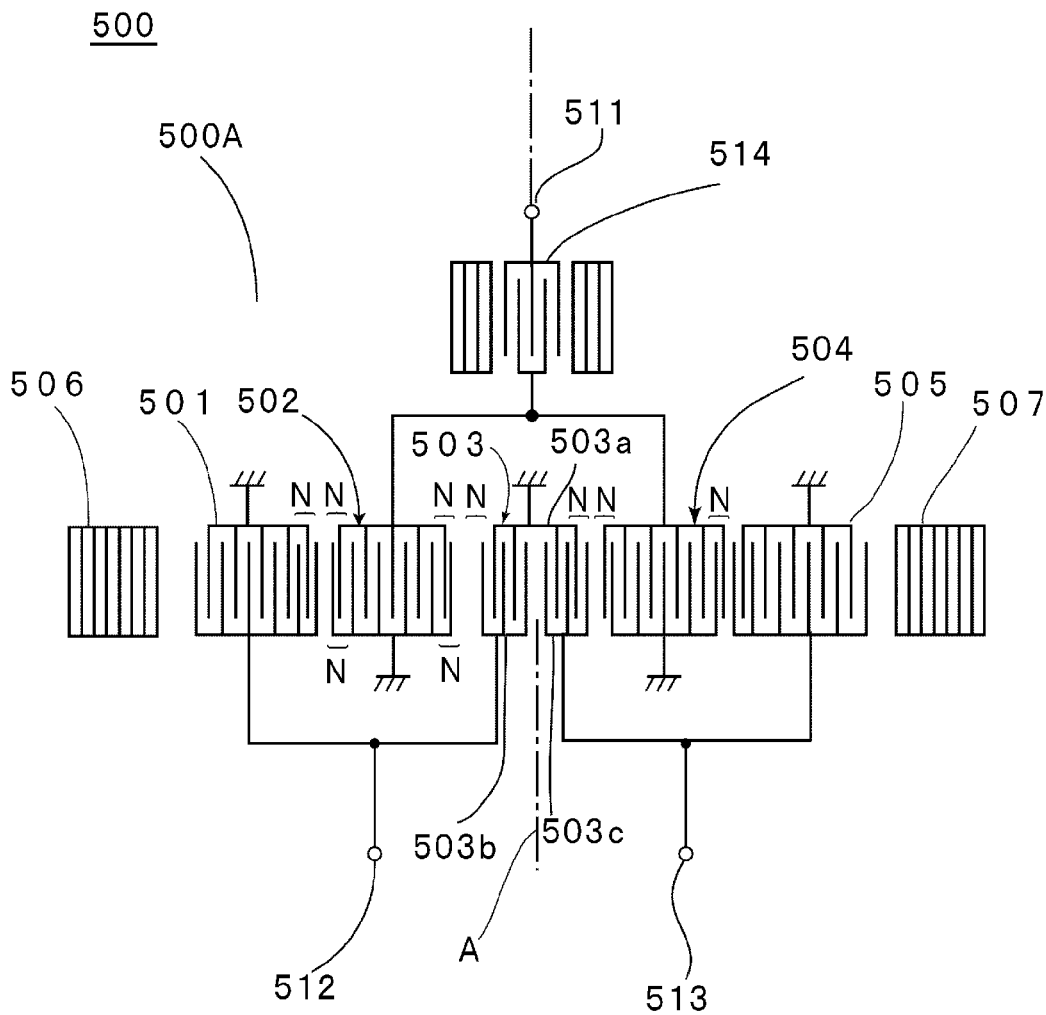
FIG. 16 is a schematic plan view showing the electrode structure of a surface acoustic wave filter according to a third preferred embodiment of the present invention.

FIG. 16 is a schematic plan view showing the electrode structure of a surface acoustic wave filter 500 according to a third preferred embodiment of the present invention. In the surface acoustic wave filter 500 according to the third preferred embodiment, the electrode structure as shown in FIG. 16 is provided on the piezoelectric substrate P. As in the surface acoustic wave filter 200 according to the first preferred embodiment, the surface acoustic wave filter 500 according to the third preferred embodiment preferably includes a longitudinally coupled resonator-type surface acoustic wave filter unit 500A and a surface acoustic wave resonator 514 coupled in series thereto. The surface acoustic wave filter 500 according to the third preferred embodiment has a basic structure similar to that of the surface acoustic wave filter 200 according to the first preferred embodiment. For this reason, the same components are assigned 500-range reference numerals rather than 200-range ones and will not be described in detail.

In the third preferred embodiment, the longitudinally coupled resonator-type surface acoustic wave filter unit 500A preferably includes first to fifth IDTs 501 to 505 arranged in the surface acoustic wave propagation direction. The central third IDT 503 preferably includes a comb-shaped electrode 503a and first and second divided comb-shaped electrodes 503b and 503c. The first and second divided comb-shaped electrodes 503b and 503c are preferably formed by dividing a comb-shaped electrode on the other side opposed to the comb-shaped electrode 503a into two portions in the surface acoustic wave propagation directions. The first and second divided comb-shaped electrodes 503b and 503c are arranged in the surface acoustic wave propagation direction. First and second reflectors 505 and 506 are disposed on both sides in the surface acoustic wave propagation direction of the area in which the first to fifth IDTs 501 to 505 are disposed. In the surface acoustic wave filter 500 according to the third preferred embodiment, the first and fifth IDTs 501 and 505 are inverted relative to the first and fifth IDTs 201 and 205, respectively, of the surface acoustic wave filter 200 according to the first preferred embodiment, and the outermost electrode fingers of the third IDT 503 are electrode fingers connected to signal terminals.

End portions of the second and fourth IDTs 502 and 504 are connected to an unbalanced signal terminal 511 via a surface acoustic wave resonator 514. The other end portions of the second and fourth IDTs 502 and 504 are connected to the ground potential. End portions of the first and fifth IDTs 501 and 505 are connected to the ground potential. The other end portion of the first IDT 501 and the first divided comb-shaped electrode 503b of the third IDT 503 are mutually connected and then connected to a first balanced signal terminal 512. The second divided comb-shaped electrode 503c of the third IDT 503 and the other end portion of the fifth IDT 505 are mutually connected and then connected to a second balanced signal terminal 513. The comb-shaped electrode 503a of the central third IDT 503 is connected to the ground potential.

In the third preferred embodiment, as in the first preferred embodiment, the fourth IDT 504 is inverted relative to the second IDT 502 so as to provide the balanced-unbalanced conversion function.

As shown in FIG. 16, narrow-pitch electrode finger sections are preferably provided in the areas in which two IDTs are adjacent to each other of the first to fifth IDTs 501 to 505. The electrode finger pitch of the multiple electrode fingers of a narrow-pitch electrode finger section of an IDT, including the outermost electrode finger located at the end portion of the IDT, is preferably less than the electrode finger pitch of the other section of the IDT. In FIG. 16, each narrow-pitch electrode finger section is schematically indicated by N. The section except the section (narrow-pitch electrode finger section) indicated by N of an IDT is an electrode finger section having an electrode finger pitch different from that of the narrow-pitch electrode finger section, that is, a main-pitch electrode finger section.

As shown in FIG. 16, in the area in which the first IDT 501 and the second IDT 502 are adjacent to each other, the outermost electrode finger of the first IDT 501 is an electrode finger connected to a signal terminal, and that of the second IDT 502 is an electrode finger connected to the ground potential. That is, both electrode fingers have different polarities.

On the other hand, in the area in which the fourth IDT 504 and the fifth IDT 505 are adjacent to each other, the outermost electrode fingers of the fourth IDT 504 and the fifth IDT 505 are electrode fingers connected to signal terminals. That is, both electrode fingers have the same polarity.

In the area in which the second IDT 502 and the third IDT 503 are adjacent to each other, the outermost electrode finger of the second IDT 502 is an electrode finger connected to the ground potential, and that of the third IDT 503 is an electrode finger connected to a signal terminal. That is, both electrode fingers have different polarities.

On the other hand, in the area in which the third IDT 503 and the fourth IDT 504 are adjacent to each other, the outermost electrode fingers of the third IDT 503 and the fourth IDT 504 are electrode fingers connected to signal terminals. That is, both electrode fingers have the same polarity.

Thus, in the area in which the first IDT 501 and the second IDT 502 are adjacent to each other, signals passing through the second IDT 502 and those passing through the first IDT 501 are in opposite phase. On the other hand, in the area in which the fourth IDT 504 and the fifth IDT 505 are adjacent to each other, signals passing through the fourth IDT 504 and those passing through the fifth IDT 505 are in phase.

The surface acoustic wave filter 500 according to this preferred embodiment is preferably configured as follows. The electrode finger pitches of the main-pitch electrode finger sections of the second and fourth IDTs 502 and 504 are equal or substantially equal to each other. In the third IDT 503, the electrode finger pitches of the main-pitch electrode finger sections of the portion including the comb-shaped electrode 503*a* and the first divided comb-shaped electrode 503*b* and the portion including the comb-shaped electrode 503*a* and the second divided electrode 503*c* are equal or substantially equal to each other. The electrode finger pitch of the main-pitch electrode finger section of the fifth IDT 505 is less than that of the main-pitch electrode finger section of the first IDT 501.

In the surface acoustic wave filter 500 according to this preferred embodiment, the electrode finger pitch of the main-pitch electrode finger section of the fifth IDT 505 is preferably less than that of the main-pitch electrode finger section of the first IDT 501. More specifically, the electrode finger pitch of the main-pitch electrode finger section of the fifth IDT 505 is preferably less than that of the main-pitch electrode finger section of the first IDT 501 by approximately, for example, 0.2% of the latter electrode finger pitch.

That is, this preferred embodiment is preferably configured as follows: in the area in which the first IDT 501 connected to the first balanced signal terminal 512 and located most outside and the second IDT 502 connected to the unbalanced signal terminal 511 are adjacent to each other, signals passing through the adjacent two IDTs are in phase; in the area in which the fifth IDT 505 connected to the second balanced signal terminal 513 and located most outside and the fourth IDT 504 connected to the unbalanced signal terminal 511 are adjacent to each other, signals passing through the adjacent two IDTs are in opposite phase; and the electrode finger pitch of the main-pitch electrode finger section of the fifth IDT 505 is less than that of the main-pitch electrode finger section of the first IDT 501.

In this preferred embodiment, the structure provided on the piezoelectric substrate P is symmetrical or substantially symmetrical with respect to the virtual central axis A extending in directions perpendicular to the surface acoustic wave propagation directions except that the electrode finger pitches of the main-pitch electrode finger sections of the first IDT 501 and the fifth IDT 505 differ from each other. Thus, balance is increased. This is because few unbalanced components occur except that the outermost electrode fingers adjacent to the third IDT 503, of the second IDT 502 and the fourth IDT 504 adjacent to the centered third IDT 503 have different polarities between the second IDT 502 and fourth IDT 504.

Since, in this preferred embodiment, the first to fifth IDT 501 to 505 are configured as described above, balance is improved. This will be described with reference to FIGS. 17 and 18.

To compare with the surface acoustic wave filter 500 according to this preferred embodiment, a surface acoustic wave filter according to a seventh comparative example and one according to an eighth comparative example were prepared. The surface acoustic wave filter according to the seventh comparative example has substantially the same configuration as that of the surface acoustic wave filter 500 according to this preferred embodiment, except that the electrode finger pitches of the main-pitch electrode finger sections of the first IDT 501 and fifth IDT 505 are equal or substantially equal to each other. In the surface acoustic wave filter according to the eighth comparative example, contrary to the surface acoustic wave filter 500 according to this preferred embodiment, the electrode finger pitch of the main-pitch electrode finger section of the first IDT 501 is less than that of the main-pitch electrode finger section of the fifth IDT 505 by, for example, approximately 0.2% of the latter electrode finger pitch. The surface acoustic wave filter according to the eighth comparative example has substantially the same configuration as that of the surface acoustic wave filter 500 according to this preferred embodiment except that the electrode finger pitch of the main-pitch electrode finger section of the first IDT 501 is less than that of the main-pitch electrode finger section of the fifth IDT 505.

Figure 17:
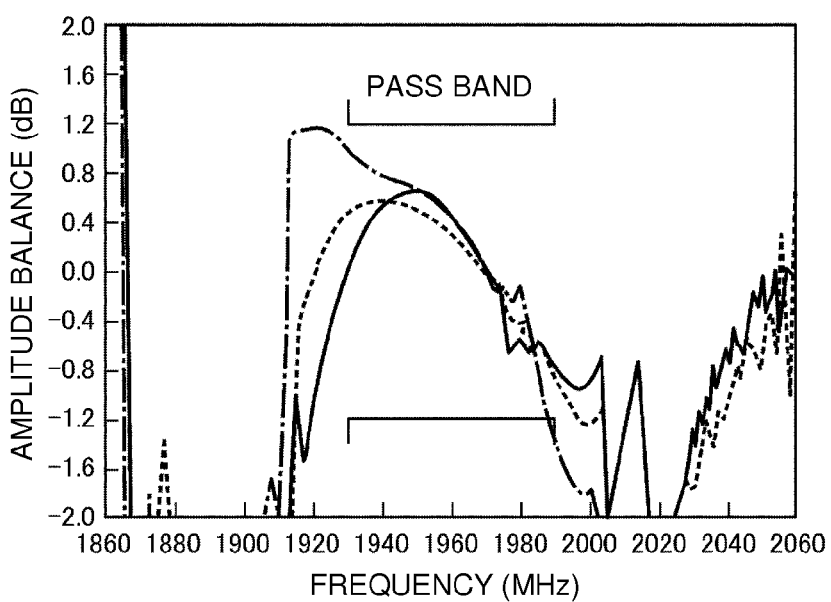
FIG. 17 is a graph showing amplitude balance of each of the surface acoustic wave filter according to the third preferred embodiment of the present invention, that according to a seventh comparative example, and that according to an eighth comparative example.
Figure 18:
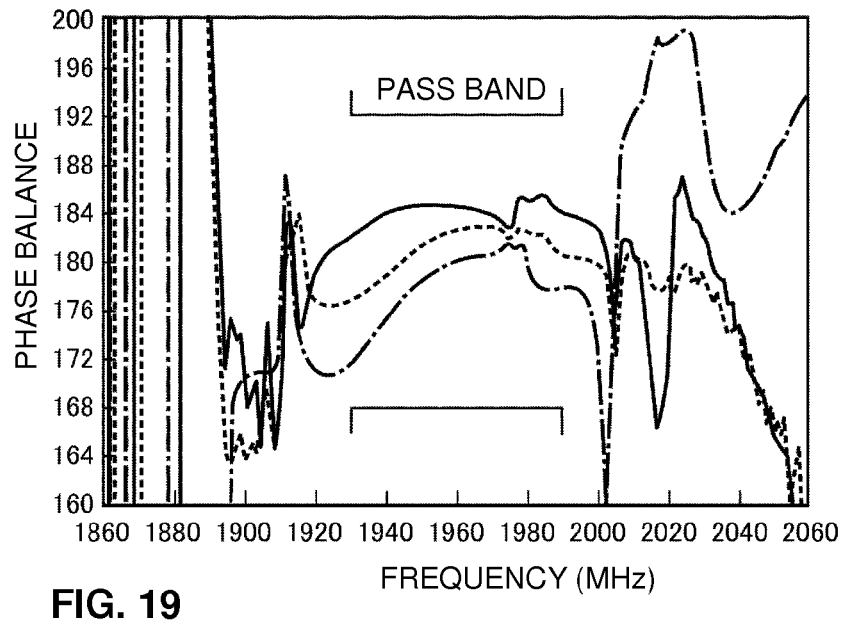
FIG. 18 is a graph showing phase balance of each of the surface acoustic wave filter according to the third preferred embodiment of the present invention, that according to the seventh comparative example, and that according to the eighth comparative example.

FIGS. 17 and 18 are graphs showing the amplitude balance and the phase balance of each of the surface acoustic wave filter 500 according to this preferred embodiment, the surface acoustic wave filter according to the seventh comparative example, and the surface acoustic wave filter according to the eighth comparative example. In FIGS. 17 and 18, the solid lines represent the surface acoustic wave filter 500 according to this preferred embodiment; the broken lines represent the surface acoustic wave filter according to the seventh comparative example; and the alternate long and short dashed lines represent the surface acoustic wave filter according to the eighth comparative example.

As is apparent from FIG. 17, the value of the amplitude balance is the worst around 1990 MHz, which is the passband upper limit of PCS reception filters, in both this preferred embodiment and the seventh comparative example. In the seventh comparative example, amplitude balance at 1990 MHz is approximately −1.2 dB. On the other hand, in this preferred embodiment, amplitude balance at 1990 MHz is approximately −1.1 dB. Thus, amplitude balance according to this preferred embodiment is improved as compared to that according to the seventh comparative example by approximately 0.1 dB. This is because the phase difference between a signal output from the first balanced signal terminal 512 and a signal output from the second balanced signal terminal 513 is corrected by making the electrode finger pitches of the main-pitch electrode finger sections of the first IDT 501 and the fifth IDT 505 different from one another.

On the other hand, as is apparent from FIG. 18, the phase balance according to this preferred embodiment is slightly worse than that according to the seventh comparative example. However, in this preferred embodiment, the worst value of phase balance falls within the range of about 168° to about 192°, for example.

As is apparent from FIG. 17, in the eighth comparative example, the value of amplitude balance is the worst around 1990 MHz, which is the pass-band upper limit of PCS reception filters. In the eighth comparative example, the amplitude balance at 1990 MHz is approximately −1.4 dB and worse than in the seventh comparative example. Moreover, in the eighth comparative example, the amplitude balance does not satisfy the range requirement of about −1.2 dB to about +1.2 dB.

As is apparent from FIG. 18, the phase balance also deteriorates in the eighth comparative example.

Accordingly, as is shown from FIGS. 17 and 18, in the third preferred embodiment, the amplitude balance can be improved without significantly deteriorating the phase balance.

Fourth Preferred Embodiment

Figure 19:
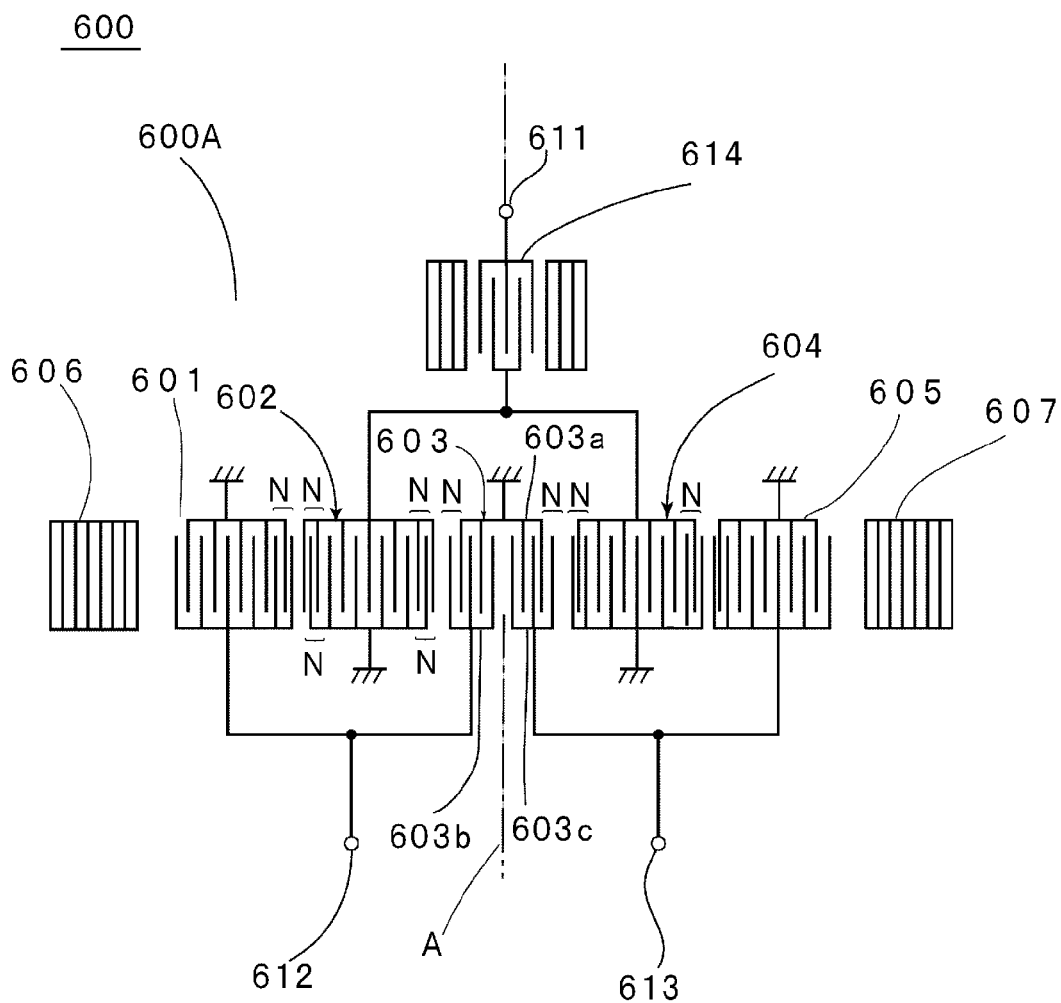
FIG. 19 is a schematic plan view showing the electrode structure of a surface acoustic wave filter according to a fourth preferred embodiment of the present invention.

FIG. 19 is a schematic plan view showing the electrode structure of a surface acoustic wave filter 600 according to a fourth preferred embodiment of the present invention. In the surface acoustic wave filter 600 according to the fourth preferred embodiment, the electrode structure as shown in FIG. 19 is provided on the piezoelectric substrate P.

As in the surface acoustic wave filter 200 according to the first preferred embodiment, the surface acoustic wave filter 600 according to the fourth preferred embodiment preferably includes a longitudinally coupled resonator-type surface acoustic wave filter unit 600A and a surface acoustic wave resonator 614 coupled in series thereto. The surface acoustic wave filter 600 according to the fourth preferred embodiment has a basic structure similar to that of the surface acoustic wave filter 200 according to the first preferred embodiment. For this reason, the same components are assigned 600-range reference numerals rather than 200-range ones and will not be described in detail.

In the fourth preferred embodiment, the longitudinally coupled resonator-type surface acoustic wave filter unit 600A preferably includes first to fifth IDTs 601 to 605 arranged in the surface acoustic wave propagation direction. The central third IDT 603 preferably includes a comb-shaped electrode 603a and first and second divided comb-shaped electrodes 603b and 603c. The first and second divided comb-shaped electrode 603b and 603c are preferably formed by dividing a comb-shaped electrode on the other side opposed to the comb-shaped electrode 603a into two portions in the surface acoustic wave propagation directions. The first and second divided comb-shaped electrodes 603b and 603c are arranged in the surface acoustic wave propagation direction. First and second reflectors 606 and 607 are disposed on both sides in the surface acoustic wave propagation directions, of the area in which the first to fifth IDTs 601 to 605 are disposed. In the surface acoustic wave filter 600 according to the fourth preferred embodiment, the first IDT 601, the second IDT 602, the fourth IDT 604, and the fifth IDT 605 are preferably inverted relative to the first IDT 201, the second IDT 202, the fourth IDT 204, and the fifth IDT 205, respectively, of the surface acoustic wave filter 200 according to the first preferred embodiment, and the outermost electrode fingers of the third IDT 603 are electrode fingers connected to signal terminals.

End portions of the second and fourth IDTs 602 and 604 are connected to an unbalanced signal terminal 611 via a surface acoustic wave resonator 614. The other end portions of the second and fourth IDTs 602 and 604 are connected to the ground potential. End portions of the first and fifth IDTs 601 and 605 are connected to the ground potential. The other end portions of the first IDT 601 and the first divided comb-shaped electrode 603b of the third IDT 603 are mutually connected and then connected to a first balanced signal terminal 612. The second divided comb-shaped electrode 603c of the third IDT 603 and the other end portion of the fifth IDT 605 are mutually connected and then connected to a second balanced signal terminal 613. The comb-shaped electrode 603a of the centered third IDT 603 is connected to the ground potential.

In the fourth preferred embodiment, as in the first preferred embodiment, the fourth IDT 604 is inverted relative to the second IDT 602 so as to provide the balanced-unbalanced conversion function.

As shown in FIG. 19, narrow-pitch electrode finger sections are preferably provided in the areas in which two IDTs are adjacent to each other, of the first to fifth IDTs 601 to 605. The electrode finger pitch of the multiple electrode fingers of a narrow-pitch electrode finger section of an IDT, including the outermost electrode finger located at the end portion of the IDT, is preferably less than the electrode finger pitch of the other section of the IDT. In FIG. 19, each narrow-pitch electrode finger section is schematically indicated by N. The section except the section (narrow-pitch electrode finger section) indicated by N, of an IDT is an electrode finger section having an electrode finger pitch different from that of the narrow-pitch electrode finger section, that is, a main-pitch electrode finger section.

As shown in FIG. 19, in the area in which the first IDT 601 and the second IDT 602 are adjacent to each other, the outermost electrode fingers of the first IDT 601 and the second IDT 602 are electrode fingers connected to signal terminals. That is, both electrode fingers have the same polarity.

On the other hand, in the area in which the fourth IDT 604 and the fifth IDT 605 are adjacent to each other, the outermost electrode finger of the fourth IDT 604 is an electrode finger connected to the ground potential, and that of the fifth IDT 605 is an electrode finger connected to a signal terminal. That is, both electrode fingers have different polarities.

In the area in which the second IDT 602 and the third IDT 603 are adjacent to each other, the outermost electrode fingers of the second IDT 602 and the third IDT 603 are electrode fingers connected to signal terminals. That is, both electrode fingers have the same polarity.

On the other hand, in the area in which the third IDT 603 and the fourth IDT 604 are adjacent to each other, the outermost electrode finger of the third IDT 603 is an electrode finger connected to a signal terminal, and that of the fourth IDT 604 is an electrode finger connected to the ground potential. That is, both electrode fingers have different polarities.

Thus, in the area in which the first IDT 601 and the second IDT 602 are adjacent to each other, signals passing through the second IDT 602 and those passing through the first IDT 601 are in phase. On the other hand, in the area in which the fourth IDT 604 and the fifth IDT 605 are adjacent to each other, signals passing through the fourth IDT 604 and those passing through the fifth IDT 605 are in opposite phase.

The surface acoustic wave filter 600 according to this preferred embodiment is preferably configured as follows. The electrode finger pitches of the main-pitch electrode finger sections of the second and fourth IDTs 602 and 604 are equal or substantially equal to each other. In the third IDT 603, the electrode finger pitches of the main-pitch electrode finger sections of the portion including the comb-shaped electrode 603a and the first divided comb-shaped electrode 603b and the portion including the comb-shaped electrode 603a and the second divided electrode 603c are equal or substantially equal to each other. The electrode finger pitch of the main-pitch electrode finger section of the first IDT 601 is less than that of the main-pitch electrode finger section of the fifth IDT 605.

In the surface acoustic wave filter 600 according to this preferred embodiment, preferably, the electrode finger pitch of the main-pitch electrode finger section of the first IDT 601 is less than that of the main-pitch electrode finger section of the fifth IDT 605. More specifically, the electrode finger pitch of the main-pitch electrode finger section of the first IDT 601 is preferably less than that of the main-pitch electrode finger section of the fifth IDT 605 by, for example, approximately 0.2% of the latter electrode finger pitch.

That is, this preferred embodiment is preferably configured as follows: in the area in which the first IDT 601 connected to the first balanced signal terminal 612 and located most outside and the second IDT 602 connected to the unbalanced signal terminal 611 are adjacent to each other, signals passing through the adjacent two IDTs are in phase; in the area in which the fifth IDT 205 connected to the second balanced signal terminal 613 and located most outside and the fourth IDT 604 connected to the unbalanced signal terminal 611 are adjacent to each other, signals passing through the adjacent two IDTs are in opposite phase; and the electrode finger pitch of the main-pitch electrode finger section of the first IDT 601 is less than that of the main-pitch electrode finger section of the fifth IDT 605.

In this preferred embodiment, the structure on the piezoelectric substrate P is symmetrical or substantially symmetrical with respect to the virtual central axis A extending in directions perpendicular to the surface acoustic wave propagation directions except that the electrode finger pitches of the main-pitch electrode finger sections of the first IDT 601 and the fifth IDT 605 differ from each other. Thus, balance is improved. This is because few unbalanced components occur, except that the outermost electrode fingers adjacent to the third IDT 603, of the second IDT 602 and the fourth IDT 604 adjacent to the centered third IDT 203 have different polarities between the second and fourth IDTs 602 and 604.

To compare with the surface acoustic wave filter 600 according to this preferred embodiment, a surface acoustic wave filter according to a ninth comparative example and one according to a tenth comparative example were prepared.

The surface acoustic wave filter according to the ninth comparative example has substantially the same configuration as that of the surface acoustic wave filter 600 according to this preferred embodiment, except that the electrode finger pitches of the main-pitch electrode finger sections of the first IDT 601 and the fifth IDT 605 are equal or substantially equal to each other.

In the surface acoustic wave filter according to tenth comparative example, contrary to the surface acoustic wave filter 600 according to this preferred embodiment, the electrode finger pitch of the main-pitch electrode finger section of the fifth IDT 605 is less than that of the main-pitch electrode finger section of the first IDT 601 by, for example, approximately 0.2% of the latter electrode finger pitch. The surface acoustic wave filter according to the tenth comparative example has substantially the same configuration as that of the surface acoustic wave filter 600 according to this preferred embodiment, except that the electrode finger pitch of the main-pitch electrode finger section of the fifth IDT 605 is less than that of the main-pitch electrode finger section of the first IDT 601.

Figure 20:
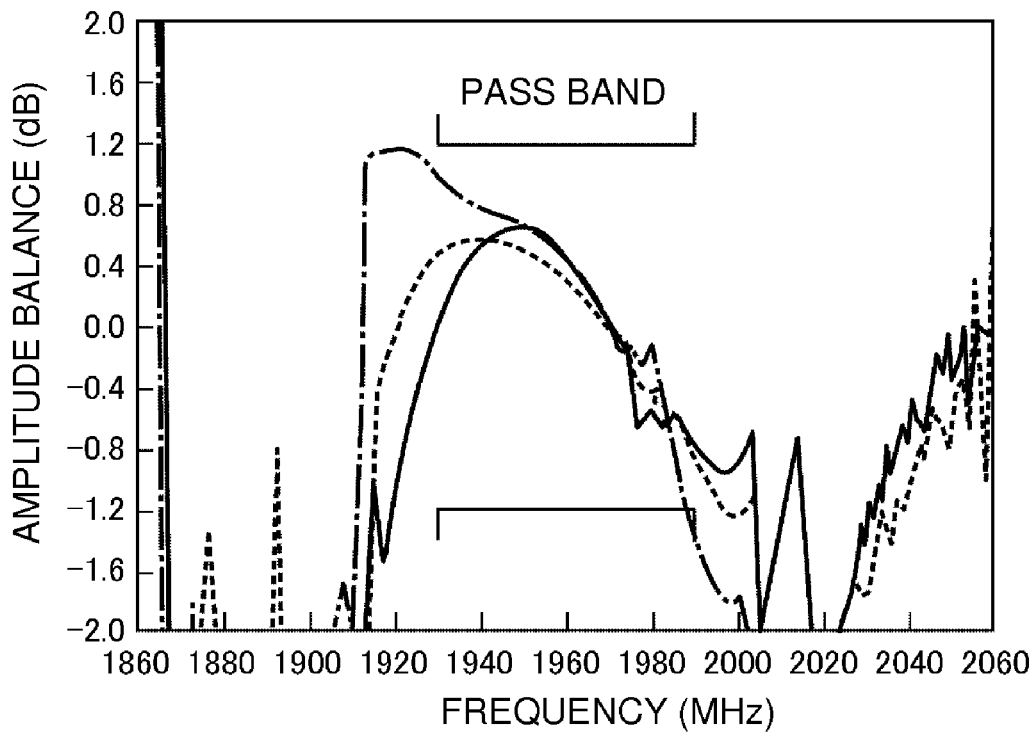
FIG. 20 is a graph showing amplitude balance of each of the surface acoustic wave filter according to the fourth preferred embodiment of the present invention, that according to a ninth comparative example, and that according to a tenth comparative example.
Figure 21:
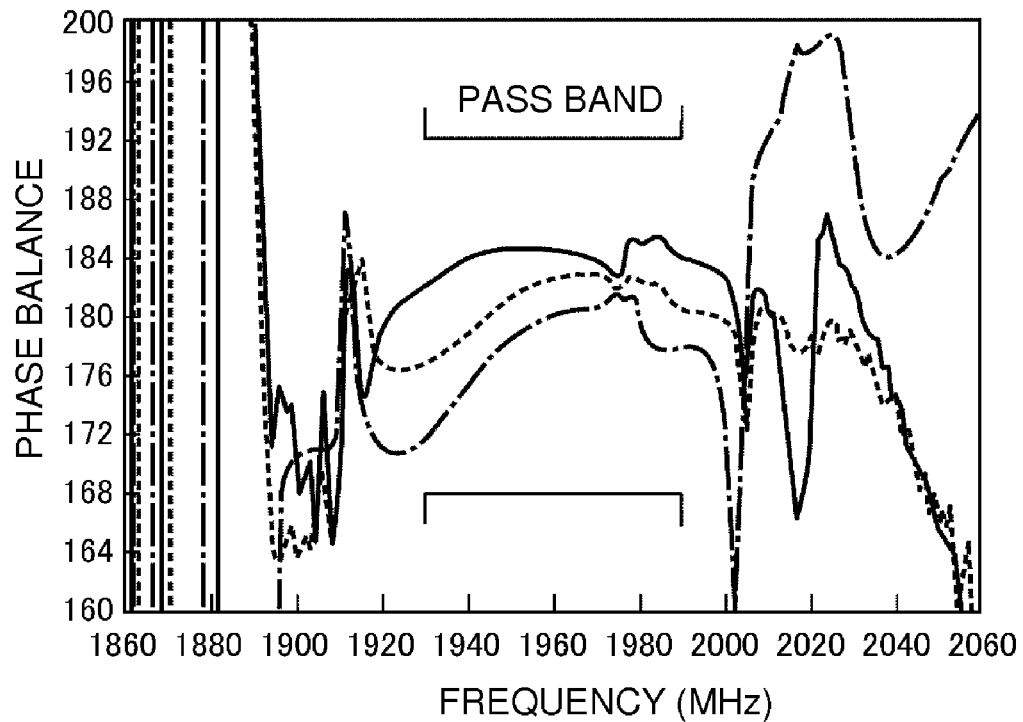
FIG. 21 is a graph showing phase balance of each of the surface acoustic wave filter according to the fourth preferred embodiment of the present invention, that according to the ninth comparative example, and that according to the tenth comparative example.

FIGS. 20 and 21 are graphs showing the amplitude balance and the phase balance of each of the surface acoustic wave filter 600 according to this preferred embodiment, the surface acoustic wave filter according to the ninth comparative example, and the surface acoustic wave filter according to the tenth comparative example. In FIGS. 20 and 21, the solid lines represent the surface acoustic wave filter 600 according to this preferred embodiment; the broken lines represent the surface acoustic wave filter according to the ninth comparative example; and the alternate long and short dashed lines represent the surface acoustic wave filter according to the tenth comparative example.

As is apparent from FIG. 20, the value of the amplitude balance is the worst around 1990 MHz, which is the passband upper limit of PCS reception filters, in both this preferred embodiment and the ninth comparative example. In the ninth comparative example, the amplitude balance at 1990 MHz is approximately −1.2 dB. On the other hand, in this preferred embodiment, the amplitude balance at 1990 MHz is approximately −1.1 dB. Thus, the amplitude balance according to this preferred embodiment is improved as compared to that according to the ninth comparative example by approximately 0.1 dB. This is because the phase difference between a signal output from the first balanced signal terminal 612 and a signal output from the second balanced signal terminal 613 is corrected by making different the electrode finger pitches of the main-pitch electrode finger sections of the first IDT 601 and the fifth IDT 605.

On the other hand, as is apparent from FIG. 21, the phase balance according to this preferred embodiment is slightly worse than that according to the ninth comparative example. However, in this preferred embodiment also, the worst value of phase balance falls within the range of about 168° to about 192°.

As is apparent from FIG. 20, in the tenth comparative example also, the value of the amplitude balance is the worst around 1990 MHz, which is the pass-band upper limit of PCS reception filters. In the tenth comparative example, the amplitude balance at 1990 MHz is approximately −1.4 dB and worse than in the ninth comparative example. Moreover, in the tenth comparative example, the amplitude balance does not satisfy the range requirement of −1.2 dB to +1.2 dB. Furthermore, as is apparent from FIG. 21, the phase balance deteriorates in the tenth comparative example.

Thus, as is shown from FIGS. 20 and 21, in the fourth preferred embodiment, the amplitude balance can be improved without significantly deteriorating the phase balance.

Fifth Preferred Embodiment

A surface acoustic wave filter according to a fifth preferred embodiment of the present invention differs from the surface acoustic wave filter 200 according to the first preferred embodiment only in that the electrode finger pitches of the main-pitch electrode fingers of the first IDT and fifth IDT do not differ from each other, unlike in the surface acoustic wave filter 200 according to the first preferred embodiment and that the duty ratios of the main-pitch electrode finger sections thereof differ from each other as shown in Table 4 below. Accordingly, the surface acoustic wave filter according to the fifth preferred embodiment has an electrode structure similar to that of the surface acoustic wave filter 200 according to the first preferred embodiment. For this reason, in the following description of the fifth preferred embodiment, the first preferred embodiment shown in FIG. 1 will be cited.

TABLE 4

| IDT | Duty | | |
| --- | --- | --- | --- |
| | Eleventh comparative example | Fifth preferred embodiment | Twelfth comparative example |
| 201 | Duty Ratio 2 | Duty Ratio 2 × 0.97 | Duty Ratio 2 × 1.03 |
| 202 | Duty Ratio 3 | Duty Ratio 3 | Duty Ratio 3 |
| 203b | Duty Ratio 4 | Duty Ratio 4 | Duty Ratio 4 |
| 203c | Duty Ratio 4 | Duty Ratio 4 | Duty Ratio 4 |
| 204 | Duty Ratio 3 | Duty Ratio 3 | Duty Ratio 3 |
| 205 | Duty Ratio 2 | Duty Ratio 2 × 1.03 | Duty Ratio 2 × 0.97 |

As shown in Table 4, the surface acoustic wave filter according to this preferred embodiment is preferably configured as follows. The duty ratios of the main-pitch electrode finger sections of the second and fourth IDTs 202 and 204 are equal or substantially equal to each other. In the third IDT 203, the duty ratios of the main-pitch electrode finger sections of the portion including the comb-shaped electrode 203a and the first divided comb-shaped electrode 203b and the portion including the comb-shaped electrode 203a and the second divided comb-shaped electrode 203c are equal or substantially equal to each other. The duty ratio of the main-pitch electrode finger section of the first IDT 201 is less than that of the main-pitch electrode finger section of the fifth IDT 205.

In the surface acoustic wave filter according to this preferred embodiment, the duty ratio of the main-pitch electrode finger section of the first IDT 201 is preferably less than that of the main-pitch electrode finger section of the fifth IDT 205. More specifically, the duty ratio of the main-pitch electrode finger section of the first IDT 201 is preferably less than that of the main-pitch electrode finger section of the fifth IDT 205 by, for example, approximately 6% of the latter duty ratio.

To compare with the surface acoustic wave filter according to this preferred embodiment, a surface acoustic wave filter according to an eleventh comparative example and one according to a twelfth comparative example were prepared. The surface acoustic wave filter according to the eleventh comparative example has substantially the same configuration as that of the surface acoustic wave filter according to this preferred embodiment, except that the duty ratios of the main-pitch electrode finger sections of the first IDT 201 and the fifth IDT 205 are equal or substantially equal to each other. In the surface acoustic wave filter according to the twelfth comparative example, contrary to the surface acoustic wave filter according to this preferred embodiment, the duty ratio of the main-pitch electrode finger section of the fifth IDT 205 is less than that of the main-pitch electrode finger section of the first IDT 201 by, for example, approximately 6% of the latter duty ratio. The surface acoustic wave filter according to the twelfth comparative example has substantially the same configuration as that of the surface acoustic wave filter according to this preferred embodiment except that the duty ratio of the main-pitch electrode finger section of the fifth IDT 205 is less than that of the main-pitch electrode finger section of the first IDT 201.

Figure 22:
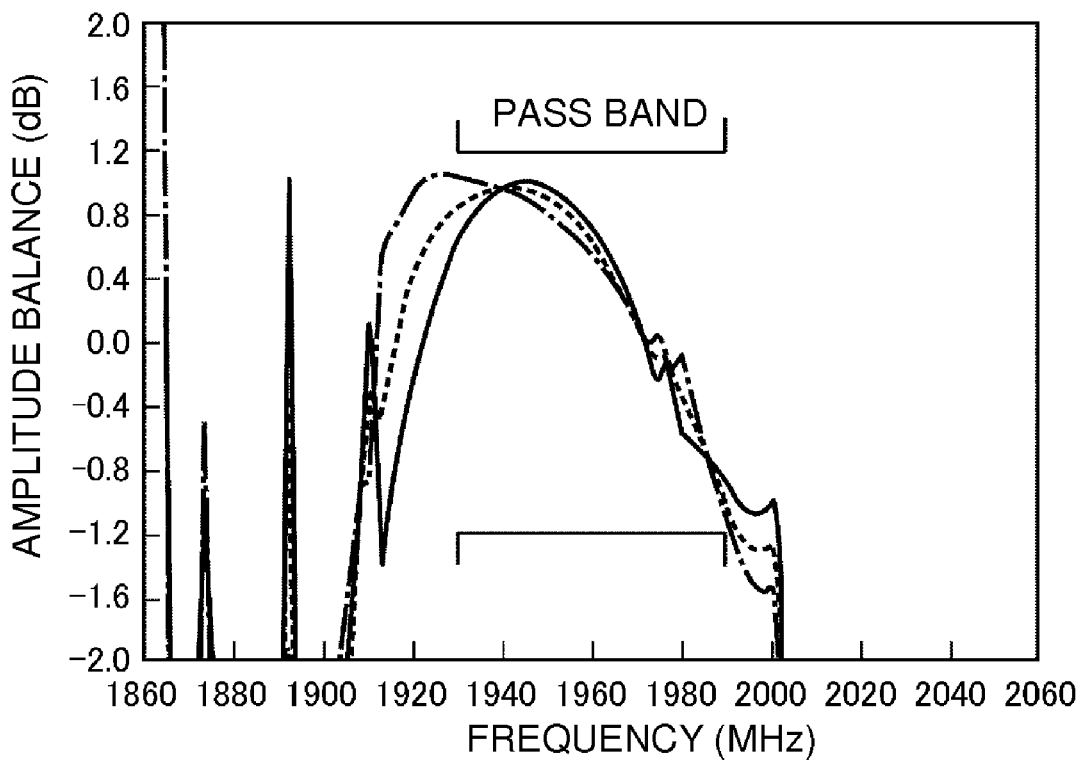
FIG. 22 is a graph showing amplitude balance of each of a surface acoustic wave filter according to a fifth preferred embodiment of the present invention, that according to an eleventh comparative example, and that according to a twelfth comparative example.
Figure 23:
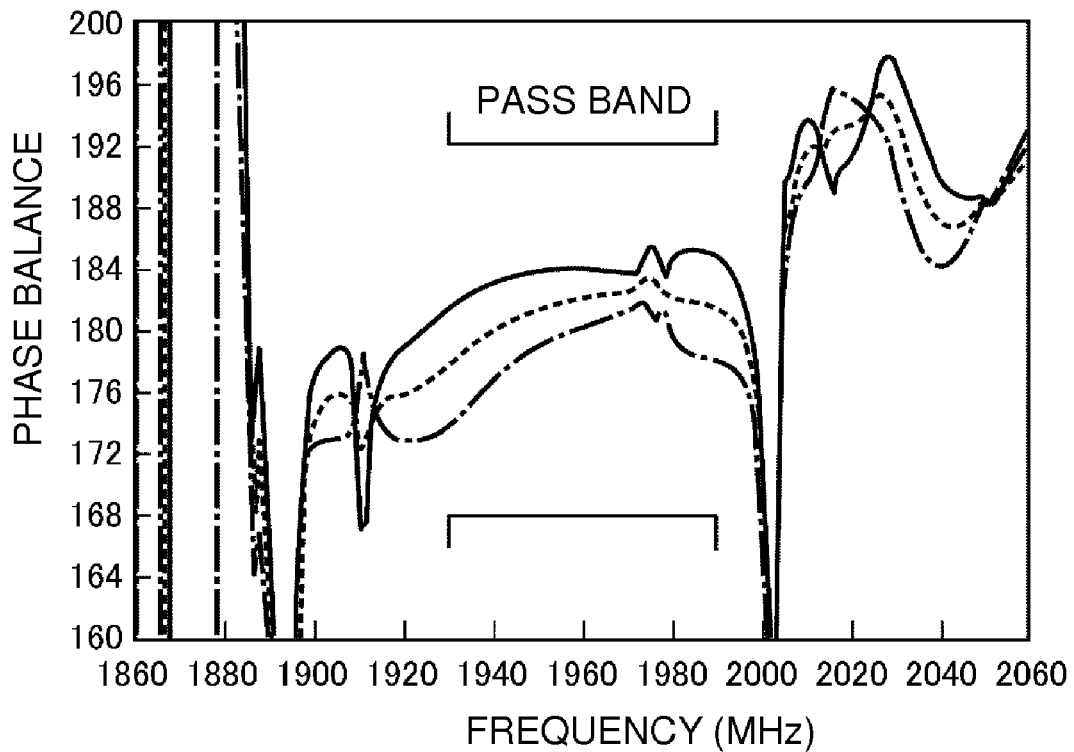
FIG. 23 is a graph showing phase balance of each of the surface acoustic wave filter according to the fifth preferred embodiment of the present invention, that according to the eleventh comparative example, and that according to the twelfth comparative example.

FIGS. 22 and 23 are graphs showing the amplitude balance and the phase balance of each of the surface acoustic wave filter according to this preferred embodiment, that according to the eleventh comparative example, and that according to the twelfth comparative example.

In FIGS. 22 and 23, the solid lines represent the surface acoustic wave filter according to this preferred embodiment; the broken lines represent that according to the eleventh comparative example; and the alternate long and short dashed lines represents that according to the twelfth comparative example.

As is apparent from FIG. 22, the value of the amplitude balance is the worst around 1990 MHz, which is the pass-band upper limit of PCS reception filters, in both of the present preferred embodiment and the eleventh comparative example. In the eleventh comparative example, the amplitude balance at 1990 MHz is approximately −1.1 dB. On the other hand, in this preferred embodiment, the amplitude balance at 1990 MHz is approximately −0.9 dB. Thus, the amplitude balance according to this preferred embodiment is improved as compared to that according to the eleventh comparative example by approximately 0.2 dB. This is because the phase difference between a signal output from the first balanced signal terminal 212 and a signal output from the second balanced signal terminal 213 is corrected by making the duty ratios of the main-pitch electrode finger sections of the first IDT 201 and the fifth IDT 205 different from one another.

On the other hand, as is apparent from FIG. 23, the phase balance according to this preferred embodiment is slightly worse than that according to the eleventh comparative example. However, in this preferred embodiment, the worst value of phase balance falls within the range of about 168° to about 192°.

As is apparent from FIG. 22, in the twelfth comparative example, the value of the amplitude balance is the worst around 1990 MHz, which the pass-band upper limit of PCS reception filters. In the twelfth comparative example, the amplitude balance at 1990 MHz is approximately −1.2 dB and worse than in the eleventh comparative example. As is apparent from FIG. 23, the phase balance deteriorates in the twelfth comparative example.

As is shown from FIGS. 22 and 23, in the fifth preferred embodiment, the amplitude balance is improved without significantly deteriorating the phase balance. Thus, as is shown from the fifth preferred embodiment, balance is also improved by making the duty ratios, instead of the electrode finger pitches, different from one another.

The surface acoustic wave filters have been described in the first to fifth preferred embodiments. As described above, preferred embodiments of the present invention obtain the advantage of improving balance due to the electrode structure of the longitudinally coupled resonator-type filters including the first to fifth IDTs. Accordingly, preferred embodiments of the present invention is applicable to surface acoustic wave filters using surface acoustic waves, as well as to boundary acoustic wave filters using boundary acoustic waves.

Figure 24:
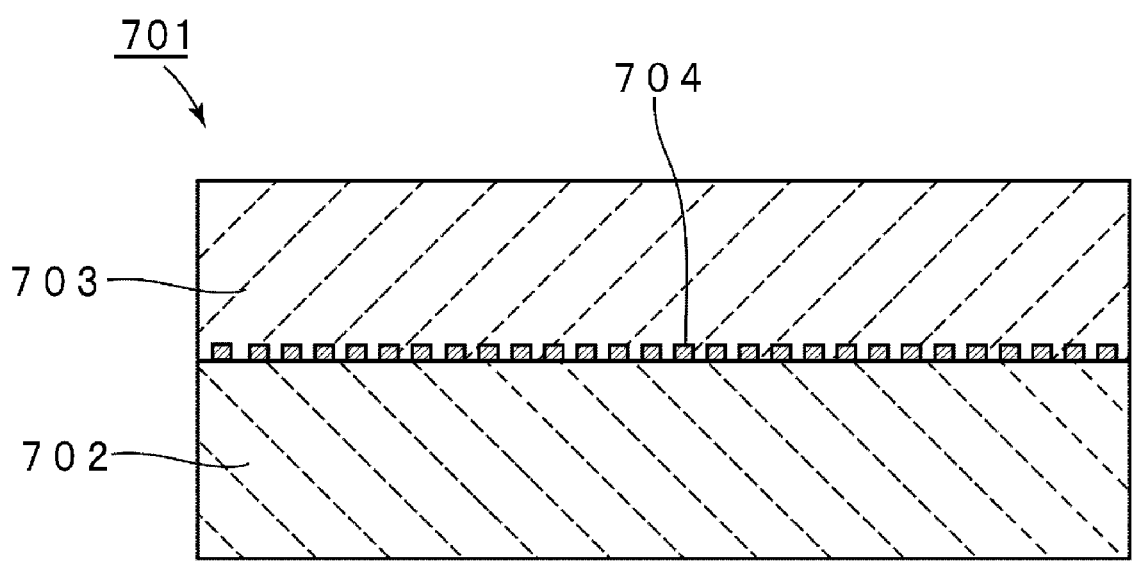
FIG. 24 is a schematic elevational cross-sectional view showing an example of a boundary acoustic wave filter according to a preferred embodiment of the present invention.

FIG. 24 is a schematic elevational cross-sectional view showing an example of a boundary acoustic wave filter 701 according to a preferred embodiment of the present invention. In the boundary acoustic wave filter 701, a dielectric 703 is preferably laminated on a piezoelectric substrate 702 made of a piezoelectric material. An electrode structure 704 including IDTs are disposed at the interface between the piezoelectric substrate 702 and the dielectric 703. The electrode structures of the above-mentioned preferred embodiments including the electrode structure 704 enables a boundary acoustic wave filter according to preferred embodiments of the present invention to be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter comprising:
a piezoelectric substrate; and
a longitudinally coupled resonator-type elastic wave filter unit provided on the piezoelectric substrate; wherein
the longitudinally coupled resonator-type elastic wave filter unit comprises first to fifth IDTs arranged in an elastic wave propagation direction and first and second reflectors arranged in the elastic wave propagation direction so as to be disposed on either side of an area in which the first to fifth IDTs are disposed;
the third IDT comprises first and second divided comb-shaped electrodes arranged in the elastic wave propagation direction, the first divided comb-shaped electrode is disposed at a side near the second IDT, and the second divided comb-shaped electrode is disposed at a side near the fourth IDT, the second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal;
each of the first and fifth IDTs has a constant electrode finger pitch, and the electrode finger pitch of the first IDT is less than the electrode finger pitch of the fifth IDT; and
a signal passing through the first IDT and a signal passing through the second IDT are in phase in an area in which the first and second IDTs are adjacent to each other.

2. The elastic wave filter according to claim 1, wherein the elastic waves are surface acoustic waves.

3. The elastic wave filter according to claim 1, wherein the elastic waves are boundary acoustic waves.

4. A communication device comprising the elastic wave filter according to claim 1.

5. An elastic wave filter comprising:
a piezoelectric substrate; and
a longitudinally coupled resonator-type elastic wave filter unit provided on the piezoelectric substrate; wherein
the longitudinally coupled resonator-type elastic wave filter unit comprises first to fifth IDTs arranged in an elastic wave propagation direction and first and second reflectors arranged in the elastic wave propagation direction so as to be disposed on either side of an area in which the first to fifth IDTs are disposed;
the third IDT comprises first and second divided comb-shaped electrodes arranged in the elastic wave propagation direction, the first divided comb-shaped electrode is disposed at a side near the second IDT, and the second divided comb-shaped electrode is disposed at a side near the fourth IDT, the second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal;
each of the first and fifth IDTs has a constant electrode finger pitch, and the electrode finger pitch of the first IDT is smaller than the electrode finger pitch of the fifth IDT; and adjacent outermost electrode fingers have the same polarity in an area in which the first and second IDTs are adjacent to each other.

6. The elastic wave filter according to claim 5, wherein the elastic waves are surface acoustic waves.

7. The elastic wave filter according to claim 5, wherein the elastic waves are boundary acoustic waves.

8. A communication device comprising the elastic wave filter according to claim 5.

9. An elastic wave filter comprising:
a piezoelectric substrate; and
a longitudinally coupled resonator-type elastic wave filter unit provided on the piezoelectric substrate; wherein
the longitudinally coupled resonator-type elastic wave filter unit comprises first to fifth IDTs arranged in an elastic wave propagation direction and first and second reflectors arranged in the elastic wave propagation direction so as to be disposed on either side of an area in which the first to fifth IDTs are disposed;
the third IDT comprises first and second divided comb-shaped electrodes arranged in the elastic wave propagation direction, the first divided comb-shaped electrode is disposed at a side near the second IDT, and the second divided comb-shaped electrode is disposed at a side near to the fourth IDT, the second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal,
each of the first and fifth IDTs comprises a main-pitch electrode finger section and a narrow-pitch electrode finger section having a smaller electrode finger pitch than that of the main-pitch electrode finger section, and the electrode finger pitch of the main-pitch electrode finger section of the first IDT is less than the electrode finger pitch of the main-pitch electrode finger section of the fifth IDT, or the electrode finger pitch of the narrow-pitch electrode finger section of the first IDT is less than the electrode finger pitch of the narrow-pitch electrode finger section of the fifth IDT; and
a signal passing through the first IDT and a signal passing through the second IDT are in phase in an area in which the first and second IDTs are adjacent to each other.

10. The elastic wave filter according to claim 9, wherein the elastic waves are surface acoustic waves.

11. The elastic wave filter according to claim 9, wherein the elastic waves are boundary acoustic waves.

12. A communication device comprising the elastic wave filter according to claim 9.

13. An elastic wave filter comprising:
a piezoelectric substrate; and
a longitudinally coupled resonator-type elastic wave filter unit provided on the piezoelectric substrate; wherein
the longitudinally coupled resonator-type elastic wave filter unit comprises first to fifth IDTs arranged in an elastic wave propagation direction and first and second reflectors arranged in the elastic wave propagation direction so as to be disposed on either side of an area in which the first to fifth IDTs are disposed;
the third IDT comprises first and second divided comb-shaped electrodes arranged in the elastic wave propagation direction, the first divided comb-shaped electrode is disposed at a side near the second IDT, and the second divided comb-shaped electrode is disposed at a side near the fourth IDT, the second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal;

each of the first and fifth IDTs comprises a main-pitch electrode finger section and a narrow-pitch electrode finger section having a smaller electrode finger pitch than that of the main-pitch electrode finger section, and the electrode finger pitch of the main-pitch electrode finger section of the first IDT is less than the electrode finger pitch of the main-pitch electrode finger section of the fifth IDT, or the electrode finger pitch of the narrow-pitch electrode finger section of the first IDT is less than the electrode finger pitch of the narrow-pitch electrode finger section of the fifth IDT; and adjacent outermost electrode fingers have the same polarity in an area in which the first and second IDTs are adjacent to each other.

14. The elastic wave filter according to claim 13, wherein the elastic waves are surface acoustic waves.

15. The elastic wave filter according to claim 13, wherein the elastic waves are boundary acoustic waves.

16. A communication device comprising the elastic wave filter according to claim 13.

17. An elastic wave filter comprising:
a piezoelectric substrate; and
a longitudinally coupled resonator-type elastic wave filter unit provided on the piezoelectric substrate; wherein
the longitudinally coupled resonator-type elastic wave filter unit comprises first to fifth IDTs arranged in an elastic wave propagation direction and first and second reflectors arranged in the elastic wave propagation direction so as to disposed on either side of an area in which the first to fifth IDTs are disposed;
the third IDT comprises first and second divided comb-shaped electrodes arranged in the elastic wave propagation direction, the first divided comb-shaped electrode is disposed at a side near the second IDT, and the second divided comb-shaped electrode is disposed at a side near the fourth IDT;
the second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal;
a duty ratio of the first IDT is less than a duty ratio of the fifth IDT; and
a signal passing through the first IDT and a signal passing through the second IDT are in phase in an area in which the first and second IDTs are adjacent to each other.

18. The elastic wave filter according to claim 17, wherein the elastic waves are surface acoustic waves.

19. The elastic wave filter according to claim 17, wherein the elastic waves are boundary acoustic waves.

20. A communication device comprising the elastic wave filter according to claim 17.

21. An elastic wave filter comprising:
a piezoelectric substrate; and
a longitudinally coupled resonator-type elastic wave filter unit provided on the piezoelectric substrate; wherein
the longitudinally coupled resonator-type elastic wave filter unit comprises first to fifth IDTs arranged in an elastic wave propagation direction and first and second reflectors arranged in the elastic wave propagation direction so as to be disposed on either side of an area in which the first to fifth IDTs are disposed;
the third IDT comprises first and second divided comb-shaped electrodes arranged in the elastic wave propagation direction, the first divided comb-shaped electrode is disposed at a side near the second IDT, and the second divided comb-shaped electrode is disposed at a side near to the fourth IDT;
the second and fourth IDTs are connected to an unbalanced signal terminal, the first IDT and the first divided comb-shaped electrode of the third IDT are connected to a first balanced signal terminal, and the fifth IDT and the second divided comb-shaped electrode of the third IDT are connected to a second balanced signal terminal;
a duty ratio of the first IDT is less than a duty ratio of the fifth IDT; and
adjacent outermost electrode fingers have the same polarity in an area in which the first and second IDTs are adjacent to each other.

22. The elastic wave filter according to claim 21, wherein the elastic waves are surface acoustic waves.

23. The elastic wave filter according to claim 21, wherein the elastic waves are boundary acoustic waves.

24. A communication device comprising the elastic wave filter according to claim 21.

* * * * *